(12) United States Patent
Kaniwa et al.

(10) Patent No.: US 9,779,194 B2
(45) Date of Patent: Oct. 3, 2017

(54) LINK SYSTEM, LINK PROGRAM, AND LINK METHOD

(71) Applicant: FUJITSU LIMITED, Kawasaki-shi, Kanagawa (JP)

(72) Inventors: Tomo Kaniwa, Kawasaki (JP); Yoshitaka Nishio, Yokosuka (JP); Eiichi Konno, Yokohama (JP); Manabu Nakagawa, Kawasaki (JP); Yukihiko Onishi, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 81 days.

(21) Appl. No.: 14/946,900

(22) Filed: Nov. 20, 2015

(65) Prior Publication Data
US 2016/0217241 A1 Jul. 28, 2016

(30) Foreign Application Priority Data
Jan. 27, 2015 (JP) .................. 2015-013741

(51) Int. Cl.
| | | |
|---|---|---|
| *G06F 17/50* | (2006.01) | |
| *H04L 29/08* | (2006.01) | |
| *H01L 29/10* | (2006.01) | |
| *H01L 29/12* | (2006.01) | |
| *H04L 29/10* | (2006.01) | |
| *H04L 29/12* | (2006.01) | |

(52) U.S. Cl.
CPC .... *G06F 17/5045* (2013.01); *H04L 29/08126* (2013.01); *H04L 29/08081* (2013.01); *H04L 29/08108* (2013.01); *H04L 29/08135* (2013.01); *H04L 29/08153* (2013.01); *H04L 29/08846* (2013.01); *H04L 29/08882* (2013.01); *H04L 29/10* (2013.01); *H04L 29/12* (2013.01)

(58) Field of Classification Search
CPC ........... G06F 17/5045; H04L 29/08126; H04L 29/08081; H04L 29/08108; H04L 29/08135; H04L 29/08153; H04L 29/08846; H04L 29/08882; H04L 29/10; H04L 29/12
USPC .......................... 716/139; 715/751; 709/238
See application file for complete search history.

(56) References Cited

U.S. PATENT DOCUMENTS

| | | | | | |
|---|---|---|---|---|---|
| 5,418,728 | A | * | 5/1995 | Yada | .................... G06F 17/5045 700/97 |
| 5,526,817 | A | * | 6/1996 | Pfeiffer | .................. A61B 5/411 600/481 |
| 6,298,319 | B1 | * | 10/2001 | Heile | .................. G01R 31/3177 703/26 |

(Continued)

FOREIGN PATENT DOCUMENTS

| | | |
|---|---|---|
| JP | 2003-521061 | 7/2003 |
| JP | 2011-154622 | 8/2011 |

(Continued)

*Primary Examiner* — Stacy Whitmore
(74) *Attorney, Agent, or Firm* — Fujitsu Patent Center

(57) ABSTRACT

A client accepts operation information for operating a circuit design CAD tool. The client transmits the accepted operation information to an application server. The application server receives the transmitted operation information. The application server generates a result screen representing a result of operating an implementation design CAD tool according to the received operation information. The application server transmits the generated result screen to the client.

9 Claims, 26 Drawing Sheets

| EXECUTION MACHINE NAME | MACHINE IP ADDRESS | PROCESS ID | TOOL NAME | CAD DB NAME | LINK TO LINK LIST | ... |
|---|---|---|---|---|---|---|
| APPLICATION SERVER A | XXX.XXX.XXX.11 | PROCESS B | IMPLEMENTATION CAD | DATA B | - | ... |
| CLIENT A | XXX.XXX.XXX.01 | PROCESS A | CIRCUIT CAD | DATA A | ADDRESS A | ... |
| APPLICATION SERVER B | XXX.XXX.XXX.12 | PROCESS C | IMPLEMENTATION CAD | DATA C | ADDRESS A | ... |
| ... | ... | ... | ... | ... | ... | ... |

143

(56) References Cited

U.S. PATENT DOCUMENTS

| | | | | |
|---|---|---|---|---|
| 7,392,484 | B1* | 6/2008 | Garfinkel | G06F 17/21 707/999.003 |
| 7,441,219 | B2* | 10/2008 | Perry | G06F 17/5045 703/16 |
| 8,245,182 | B2* | 8/2012 | Bui | G06F 8/36 717/100 |
| 8,903,968 | B2* | 12/2014 | Dawson | H04L 67/10 709/207 |
| 2004/0225968 | A1 | 11/2004 | Look et al. | |
| 2006/0168262 | A1* | 7/2006 | Frazer | H04L 29/06 709/230 |
| 2006/0288118 | A1* | 12/2006 | Hussain | H04L 29/06027 709/238 |
| 2007/0180448 | A1* | 8/2007 | Low | G06F 3/1415 718/1 |
| 2007/0198656 | A1* | 8/2007 | Mazzaferri | G06F 3/1415 709/218 |
| 2008/0027701 | A1 | 1/2008 | Inaishi et al. | |
| 2010/0199240 | A1* | 8/2010 | Pfeil | G06F 17/50 716/137 |
| 2010/0211638 | A1* | 8/2010 | Rougier | H04L 67/34 709/205 |
| 2011/0137973 | A1* | 6/2011 | Wei | H04L 67/1008 709/202 |
| 2011/0185398 | A1 | 7/2011 | Kubota | |
| 2013/0111561 | A1* | 5/2013 | Kaushik | H04L 63/105 726/4 |
| 2014/0267339 | A1* | 9/2014 | Dowd | H04L 63/0428 345/581 |
| 2014/0298281 | A1* | 10/2014 | Varadarajan | G06F 17/5045 716/113 |
| 2014/0325669 | A1* | 10/2014 | Strasser | H04L 63/0428 726/26 |
| 2015/0341326 | A1* | 11/2015 | Premnath | H04L 63/062 713/171 |
| 2015/0358392 | A1* | 12/2015 | Ramalingam | H04L 67/10 709/203 |
| 2016/0054897 | A1* | 2/2016 | Holmes | G06F 9/4445 715/740 |
| 2016/0117436 | A1* | 4/2016 | Ng | G06F 17/5045 716/113 |
| 2017/0054792 | A1* | 2/2017 | Christopher, II | H04L 67/32 |

FOREIGN PATENT DOCUMENTS

| | | |
|---|---|---|
| WO | 0155831 | 8/2001 |
| WO | 2005038675 | 4/2005 |

* cited by examiner

| APPLICATION SERVER NAME | IP ADDRESS | ... |
|---|---|---|
| APPLICATION SERVER A | XXX.XXX.XXX.11 | ... |
| APPLICATION SERVER B | XXX.XXX.XXX.12 | ... |
| APPLICATION SERVER C | XXX.XXX.XXX.13 | ... |
| ... | ... | ... |

| FILE SERVER NAME | IP ADDRESS | ... |
|---|---|---|
| FILE SERVER A | XXX.XXX.XXX.21 | ... |
| FILE SERVER B | XXX.XXX.XXX.22 | ... |
| FILE SERVER C | XXX.XXX.XXX.23 | ... |
| ... | ... | ... |

FIG.7

| EXECUTION MACHINE NAME | MACHINE IP ADDRESS | PROCESS ID | TOOL NAME | CAD DB NAME | LINK TO LINK LIST |
|---|---|---|---|---|---|
| APPLICATION SERVER A | XXX.XXX.XXX.11 | PROCESS B | IMPLEMENTATION CAD | DATA B | - |
| CLIENT A | XXX.XXX.XXX.01 | PROCESS A | CIRCUIT CAD | DATA A | ADDRESS A |
| APPLICATION SERVER B | XXX.XXX.XXX.12 | PROCESS C | IMPLEMENTATION CAD | DATA C | ADDRESS A |
| ... | ... | ... | ... | ... | ... |

| CAD MANAGEMENT INFORMATION | | | | | 143 |
|---|---|---|---|---|---|
| EXECUTION MACHINE NAME | MACHINE IP ADDRESS | PROCESS ID | TOOL NAME | CAD DB NAME | LINK TO LINK LIST |
| APPLICATION SERVER A | xxx.xxx.xxx.11 | PROCESS B | IMPLEMENTATION CAD | DATA B | - |
| CLIENT A | xxx.xxx.xxx.01 | PROCESS A | CIRCUIT CAD | DATA A | - |
| ... | ... | ... | ... | ... | ... |

FIG.12

CAD MANAGEMENT INFORMATION ⟋143

| EXECUTION MACHINE NAME | MACHINE IP ADDRESS | PROCESS ID | TOOL NAME | CAD DB NAME | LINK TO LINK LIST |
|---|---|---|---|---|---|
| APPLICATION SERVER A | xxx.xxx.xxx.11 | PROCESS B | IMPLEMENTATION CAD | DATA B | - |
| CLIENT A | xxx.xxx.xxx.01 | PROCESS A | CIRCUIT CAD | DATA A | - |
| APPLICATION SERVER B | xxx.xxx.xxx.12 | PROCESS C | IMPLEMENTATION CAD | DATA C | - |
| ... | ... | ... | ... | ... | ... |

FIG.14

| LINK | ACCOUNT | TOOL NAME | CAD DB NAME |
|---|---|---|---|
| ☐ | - | IMPLEMENTATION CAD | DATA B |
| ☑ | - | CIRCUIT CAD | DATA A |
| ☑ | - | IMPLEMENTATION CAD | DATA C |
| ☐ | USER B | IMPLEMENTATION CAD | DATA D |

LINK SYSTEM, LINK PROGRAM, AND LINK METHOD

CROSS-REFERENCE TO RELATED APPLICATION

This application is based upon and claims the benefit of priority of the prior Japanese Patent Application No. 2015-013741, filed on Jan. 27, 2015, the entire contents of which are incorporated herein by reference.

FIELD

The embodiments discussed herein are related to a link system, a link program, and a link method.

BACKGROUND

In recent years, in circuit designing, designing is performed with multiple computer aided design (CAD) tools. For example, in circuit designing, a designer performs logical designing for performing logical designing of printed boards and implementation designing for performing designing of implementation of, for example, disposition of parts and interconnect between parts on a substrate. As a design support function for supporting such logical designing and implementation designing, a function of liking and running multiple CAD tools on a terminal device is provided. For example, such a design support function first runs, on the terminal device, a circuit design CAD tool that performs logical designing and an implementation design CAD tool that performs implementation designing. The designer then operates the implementation design CAD tool in accordance with the operation of the circuit design CAD tool. For example, when the designer selects one part in the circuit design CAD tool, the design support function selects that part also in the implementation design CAD tool. Accordingly, the above-described design support function enables a link and display of the result of operating the circuit design CAD tool and the result of operating the implementation design CAD tool on the terminal device. This, for example, allows the designer to perform a designing work while comparing by sight the result of operating the circuit design CAD tool and the result of operating the implementation design CAD tool.

International Publication Pamphlet No. WO 2005/038675

Japanese National Publication of International Patent Application No. 2003-521061

Japanese Laid-open Patent Publication No. 2011-154622

It may be, however, difficult to link multiple CAD tools and run them together by using the design support function. Because, in the implementation design CAD tool, the size of data to be used for circuit designing is large and the processing load is large due to high performance of printed boards and three-dimensional designing, it is preferable that a terminal device whose performance is high compared to the circuit design CAD tool. On the other hand, a designer who performs logical designing with the circuit design CAD tool may use a terminal device whose performance matches the circuit design CAD tool in order to reduce the costs. In that case, the performance of the terminal device used by the designer does not necessarily meet the performance sufficient to run the implementation design CAD tool. In that case, it may be difficult to link the circuit design CAD tool with the implementation design CAD tool and run them together by the design support function.

In recent years, design support services for supporting circuit designing by cloud computing have been provided. In a design support service, for example, an implementation design CAD tool is run on a high-performance server. The design support service accepts an operation by a designer from a terminal device via a network. The design support service then transmits image information generated on the server in accordance with the accepted operation and displays the image on the terminal device. In this manner, even when the performance of the terminal device is low, the design support service can provide the designer with a designing environment equivalent to that for executing the implementation design CAD tool on the terminal device.

When such a design support service is used, however, the circuit design CAD tool runs on a local terminal and the implementation design CAD tool runs on the server, which makes it difficult to link the tools and run them together.

SUMMARY

According to an aspect of the embodiments, a link system includes a terminal device on which a first application runs and a server on which a second application linkable with the first application runs, wherein the terminal device includes a memory and a processor coupled to the memory, the processor executing a process including: accepting operation information for operating the first application; and transmitting the accepted operation information to the server, and the server includes a memory and a processor coupled to the memory, the processor executing a process including: receiving the operation information transmitted by the terminal device; generating a result screen representing a result of operating the second application according to the received operation information; and transmitting the generated result screen to the terminal device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a table representing an exemplary data configuration of application server information;

FIG. 5 is a table representing an exemplary data configuration of file server information;

FIG. 7 is a table representing an exemplary data configuration of CAD management information;

FIG. 11 is an explanatory view for explaining a storage process;

FIG. 12 is an explanatory view for explaining the storage process;

FIG. 14 is a diagram depicting an exemplary selection screen;

DESCRIPTION OF EMBODIMENTS

Preferred embodiments of the present invention will be explained with reference to accompanying drawings. The embodiments do not limit the invention. The embodiments each may be combined with another as appropriate within a range in which no contradiction is caused in processing contents.

[a] First Embodiment

Figure 1:
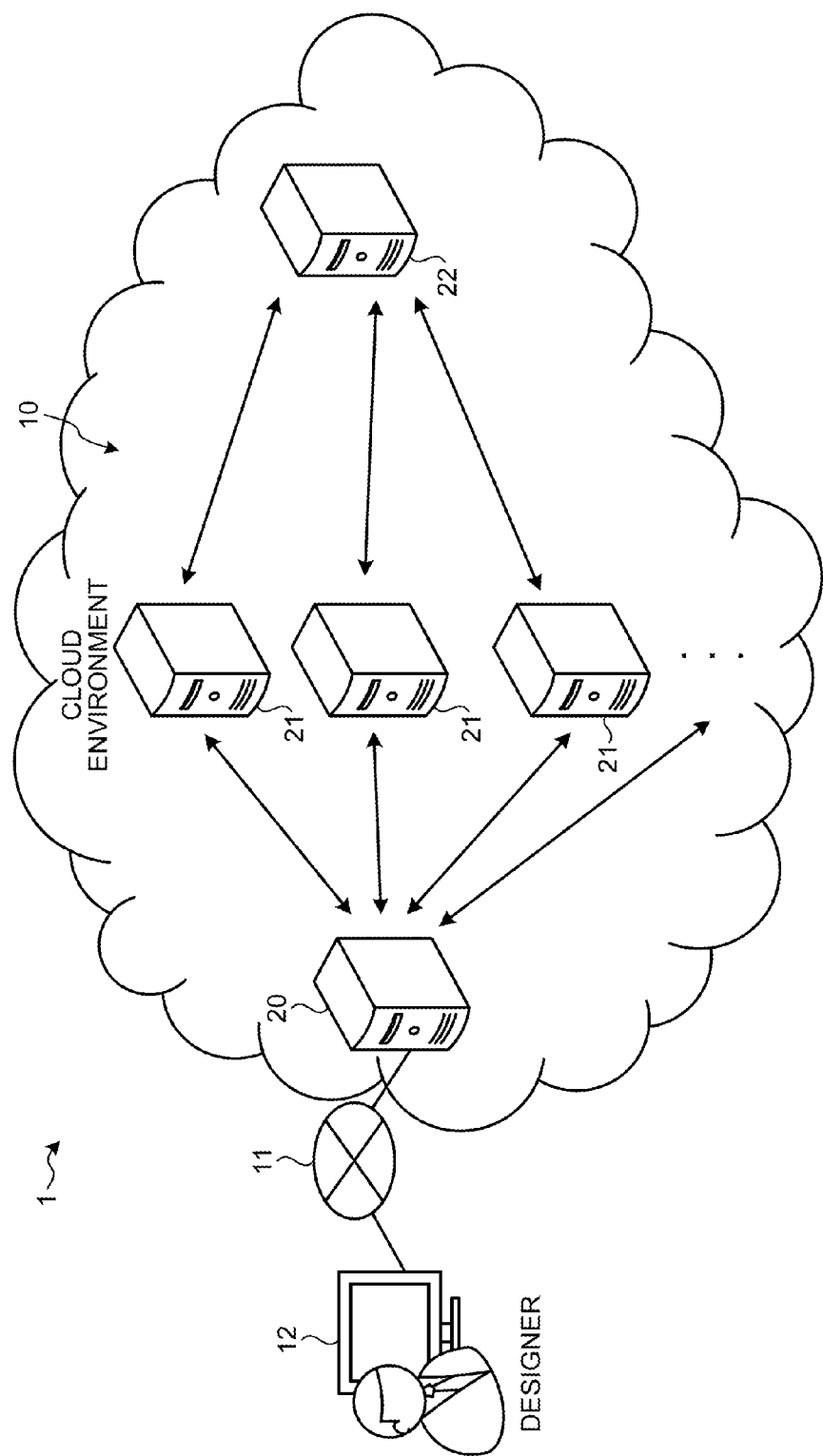
FIG. 1 is a diagram illustrating an exemplary schematic configuration of a whole link system.

A link system according to a first embodiment will be described. FIG. 1 is a diagram illustrating an exemplary schematic configuration of a whole link system. A link system 1 provides service by cloud computing. An example where the link system 1 provides a design support service as a service will be described below. As illustrated in FIG. 1, the link system 1 includes a client 12 and a cloud system 10. According to the first embodiment, the client 12 corresponds to an exemplary terminal device.

The client 12 is a computer used by a designer for circuit designing. For example, the client 12 is a desktop personal computer (PC) or a laptop PC. The designer performs logical designing of a printed board and designs disposition of parts and interconnection between parts on a substrate. For example, the designer performs logical designing by using a circuit design CAD tool that is installed in the client 12 and runs. The circuit design CAD tool according to the first embodiment corresponds to an exemplary first application. The designer performs implementation designing by using an implementation design CAD tool that runs in the cloud system 10 via the client 12. The implementation design CAD tool according to the first embodiment corresponds to an exemplary second application linkable with the first application. In other words, the implementation design CAD tool is a tool linkable with the circuit design CAD tool. For example, the designer transmits various types of information relating to implementation designing to the cloud system 10 by using the client 12 and performs implementation designing by using the designing environment provided by the cloud system 10. According to the example illustrated in FIG. 1, one client 12 is used. Alternatively, an arbitrary number of clients 12 may be used.

The cloud system 10 provides a designing environment for performing circuit designing. As illustrated in FIG. 1, the cloud system 10 includes a portal 20, application servers 21, and a file server 22. The portal 20 according to the embodiment corresponds to an exemplary relay device. The application server 21 corresponds to an exemplary server. The cloud system 10 is communicably connected to the client 12 via a network 11 and thus can exchange various types of information with the client 12. An arbitrary communication network, such as the Internet, a local area network (LAN), or a virtual private network (VPN) can be taken as a mode of the network 11 regardless whether it is wired or wireless.

The cloud system 10 accepts various types of information relating to circuit designing, etc., from the client 12 via the network 11. Upon accepting various types of information, the cloud system 10 executes a process in accordance with the accepted information. Thereafter, the cloud system 10 transmits image information representing the result of executing the process according to the accepted information to the client 12 and the client 12 displays the image. For example, the cloud system 10 accepts operation information for operating the circuit design CAD tool from the client 12 and transmits a result image representing the result of operating the implementation design CAD tool according to the received operation information to the client 12.

The portal 20, the application servers 21, and the file server 22 are communicably connected via the network 11 and thus they can exchange various types of information. A communication network, such as a LAN or a VPN can be taken as a mode of the network regardless whether it is wired or wireless. According to the example illustrated in FIG. 1, three application servers 21 are used. Alternatively, an arbitrary number of application servers 21 may be used. Furthermore, according to the example illustrated in FIG. 1, one portal 20 and one file server 22 are used. Alternatively, each of the portal 20 and the file server 22 may be comprised of multiple server computers.

The portal 20 relays communications between the client 12 and the application server 21. For example, the portal 20 is a server computer that is provided to a data center or each company. The portal 20 relays information, etc., accepted from the client 12 to the application server 21. The portal 20 also relays information on the result of processing performed by the application server 21 to the client 12.

The application server 21 is a computer that provides the designing environment. For example, the application server 21 is a server computer that is provided to the data center or each company. The application server 21 runs various types of CAD programs. For example, the application server 21 runs implementation design CAD tool linkable with a circuit design CAD tool. The application server 21 then executes a process according to information received from the client 12 via the portal 20. The application server 21 generates a result image representing the result of executing the process and transmits the generated result image to the requesting client.

The file server 22 is a computer that stores various types of data used for circuit designing. For example, the file server 22 is a server computer provided to the data center or each company. For example, the file server 22 stores DB information that is various types of data, such as design data and various types of setting information, and provides various types of data in response to a request from the application server 21.

Configuration of Client

Figure 2:
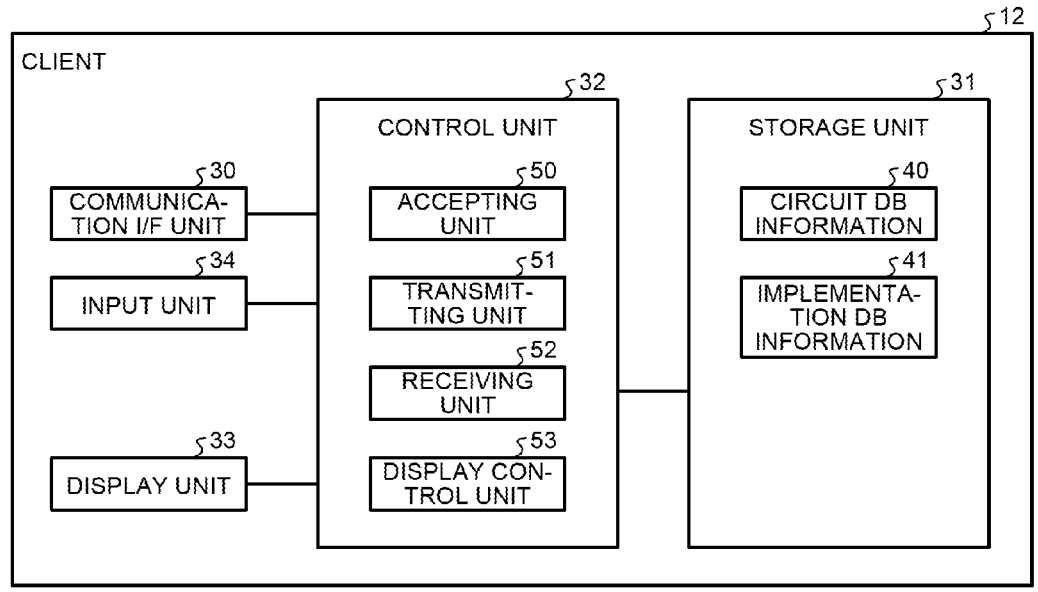
FIG. 2 is a diagram illustrating an exemplary functional configuration of a client.

The client 12 according to the first embodiment will be described below. FIG. 2 is a diagram illustrating an exemplary functional configuration of the client. As illustrated in FIG. 2, the client 12 includes a communication I/F unit 30, a storage unit 31, and a control unit 32.

The communication I/F unit 30 is an interface for performing communication control between the client 12 and other devices. The communication I/F unit 30 transmits/receives various types of information to/from other devices via the network 11. For example, the communication I/F unit 30 transmits various types of information to the portal 20 and the application server 21. The communication I/F unit 30 receives various types of information relating to CAD and notifications from the portal 20 and the application servers 21. As the communication I/F unit 30, a network interface card, such as a LAN card, may be used.

The storage unit 31 is a storage device, such as a semiconductor memory device, such as a flash memory, a hard disk, or an optical disk. The storage unit 31 may be a data-rewritable semiconductor memory, such as a random access memory (RAM), a flash memory, or a non-volatile static random access memory (NVSRAM).

The storage unit 31 stores an operating system (OS) executed by the control unit 32 and various programs for processing received requests. The storage unit 31 further stores various types of data used for the programs executed by the control unit 32. For example, the storage unit 31 stores circuit DB information 40 and implementation DB information 41.

The circuit DB information 40 is data relating to the circuit design CAD tool. For example, in the circuit DB information 40, a CAD DB for the circuit design CAD tool that is information, such as setting information and design data for the circuit design CAD tool, is stored.

The implementation DB information 41 is data relating to the implementation design CAD tool. For example, the implementation DB information 41 stores a CAD DB for the implementation design CAD tool that is information, such as setting information and design data for the implementation design CAD tool.

A display unit 33 is a device, such as a liquid crystal display, that displays various types of information. Specifically, the display unit 33 displays various types of information according to an instruction from a display control unit 53 to be described below. For example, the display unit 33 displays information relating to the circuit design CAD tool and the implementation design CAD tool.

An input unit 34 is an input device that inputs various types of information. An input device that accepts operation inputs via, for example, a mouse or a keyboard is taken as an example of the input unit 34. For example, the input unit 34 accepts various operations relating to the circuit design CAD tool and the implementation design CAD tool. For example, the input unit 34 accepts operations of, for example, searching for and selecting parts, highlighted display, or zooming on the display screen. The input unit 34 accepts an operation from the user and outputs operation information representing the contents of the accepted operation to the control unit 32.

The control unit 32 is a device that controls the client 12. As the control unit 32, an electronic circuit, such as a central processing unit (CPU) or a micro processing unit (MPU), or an integrated circuit, such as an application specific integrated circuit (ASIC) or a field programmable gate array (FPGA), can be used. The control unit 32 includes an internal memory for storing programs that define various processing procedures and control data and executes various processes by using the programs and the control data. The control unit 32 functions as various processing units by running various programs. For example, the control unit 32 includes an accepting unit 50, a transmitting unit 51, a receiving unit 52, and a display control unit 53.

The accepting unit 50 is a processing unit that accepts various types of information. Specifically, the accepting unit 50 accepts, for example, operation information for operating the circuit design CAD tool installed in the client 12. For example, the accepting unit 50 accepts operation information that linkable with another CAD tool, such as the implementation design CAD tool. For example, the accepting unit 50 accepts, as the operation information, information of an instruction for, for example, searching for and selecting parts or the like, highlighted display, and zooming in on the screen.

The transmitting unit 51 is a processing unit that transmits various types of information. For example, the transmitting unit 51 transmits operation information accepted by the accepting unit 50 to the application server 21. The transmitting unit 51 transmits a connection request requesting for connection to the portal 20 or the application server 21. The transmitting unit 51 transmits terminal information on the client 12. For example, the transmitting unit 51 transmits, as the terminal information, client-machine information, such as the machine name and the IP address of the client 12, and CAD information, such as the tool name of the circuit design CAD tool that runs on the client 12, a process ID, and the CAD DB name. The transmitting unit 51 transmits the CAD DB of the implementation design CAD tool stored in the implementation DB information 41 to the file server 22. The transmitting unit 51 transmits information for requesting for the linkable CAD tool linkable with the circuit design CAD tool or the CAD DB. The transmitting unit 51 transmits the linkable CAD tool and the CAD DB information that are selected by the user.

The transmitting unit 51 may transmit various types of information to the application server 21 or the file server 22 via the portal 20. For example, the transmitting unit 51 may transmit the operation information to the application server 21 via the portal 20.

The receiving unit 52 is a processing unit that receives various types of information. For example, the receiving unit 52 receives an authentication notice to a request for connection to the portal 20 and the application server 21. The receiving unit 52 receives a notification representing that link preparation has been completed. The receiving unit 52 receives information on the linkable CAD tool and the CAD DB. The receiving unit 52 receives a notification representing that a link has started. The receiving unit 52 receives a result screen representing the result of operating the implementation design CAD tool according to the operation information for the circuit design CAD tool.

The display control unit 53 performs display control on various types of information to be displayed on the display unit 33. Specifically, the display control unit 53 displays a result screen transmitted from the application server 21 on a web browser or the like, that is the screen for the implementation design CAD tool. For example, the display control unit 53 displays the circuit design CAD tool result screen on the screen for the circuit design CAD tool. The display control unit 53 displays the implementation design CAD tool result screen on the screen for the implementation design CAD tool.

Configuration of Portal

Figure 3:
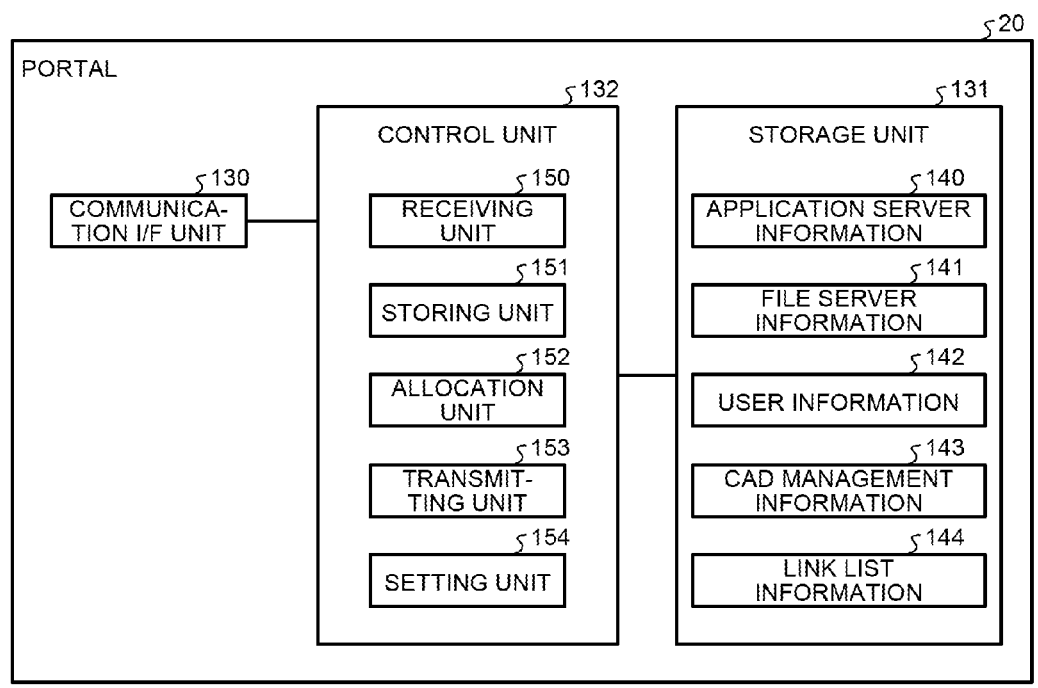
FIG. 3 is a diagram illustrating an exemplary functional configuration of a portal.

The portal 20 according to the first embodiment will be described here. FIG. 3 is a diagram illustrating an exemplary functional configuration of the portal. As illustrated in FIG. 3, the portal 20 includes a communication I/F unit 130, a storage unit 131, and a control unit 132.

The communication I/F unit 130 is an interface that performs communication control between the portal 20 and other devices. The communication I/F unit 130 transmits/receives various types of information to/from other devices via the network 11. For example, the communication I/F unit 130 receives various types of information relating to CAD from the client 12. The communication I/F unit 130 receives various types of information relating to CAD from the application server 21. As the communication I/F unit 130, a network interface card, such as a LAN card, can be used.

The storage unit 131 is a storage device, such as a semiconductor memory device, such as a flash memory, a hard disk, or an optical disk. The storage unit 131 may be a data-rewritable semiconductor memory, such as a RAM, a flash memory, or an NVSRAM.

The storage unit 131 stores an OS executed by the control unit 132 and various programs for processing received requests. The storage unit 131 further stores various types of data used for the programs executed by the control unit 132. For example, the storage unit 131 stores application server information 140, file server information 141, user information 142, CAD management information 143, and link list information 144.

The application server information 140 is information on the application server 21. For example, the application server information 140 stores, per application server 21, an application server name that identifies the application server 21 and the IP address in association with each other.

FIG. 4 is a table representing an exemplary data configuration of application server information. As the application server information 140, a table in which items of application server name and IP address are associated with each other can be used. The item of application server name is a field for storing the name that identifies the application server 21. The item of IP address is a field for storing the address allocated to the application server 21.

According to the example represented in FIG. 4, the application server 21 having the application server name of "APPLICATION SERVER A" is allocated with the IP address of "XXX.XXX.XXX.11". The application server 21 having the application server name of "APPLICATION SERVER B" is allocated with the IP address of "XXX.XXX.XXX.12".

FIG. 3 will be referred back here. The file server information 141 is information on the file server 22. For example, the file server information 141 stores, per file server 22, the file server name that identifies the file server 22 and the IP address in association with each other.

FIG. 5 is a table representing an exemplary data configuration of file server information. As the file server information 141, a table in which items of, for example, file server name and IP address are associated with each other can be used. The item of file server name is a field for storing the name that identifies the file server 22. The item of IP address is a field for storing the address allocated to the file server 22.

According to the example represented in FIG. 5, the file server 22 having the file server name of "FILE SERVER A" is allocated with the IP address of "XXX.XXX.XXX.21". Furthermore, the file server 22 having the file server name of "FILE SERVER B" is allocated with the IP address of "XXX.XXX.XXX.22".

FIG. 3 will be referred back here. The user information 142 is information on the user who uses the client 12. Specifically, in the user information 142, the user name that is a unique account for authenticating the user is stored. In the user information 142, attribute information representing the attribute of the user is stored per user.

Figure 6:
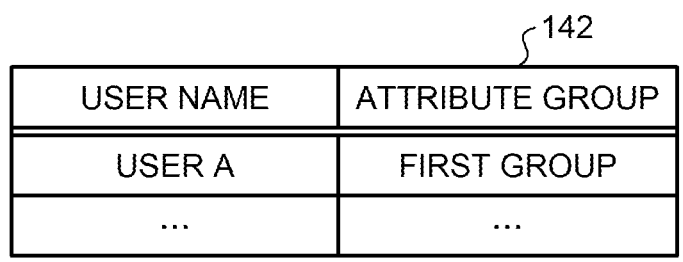
FIG. 6 is a table representing an exemplary data configuration of user information.

FIG. 6 is a table representing an exemplary data configuration of user information. As the user information 142, a table in which items of, for example, user name and attribute group are associated with each other can be used. The item of user name is a field for storing, for example, the name that identifies the user. The item of attribute group is a field for storing the name of the group to which the user belongs. According to the example represented in FIG. 6, the attribute group of the user having the user name of "USER A" is "FIRST GROUP".

FIG. 3 will be referred back here. The CAD management information 143 is information on the CAD tool. For example, in the CAD management information 143, information on the CAD tool is stored in association with the user information 142 per user account.

FIG. 7 is a table representing an exemplary data configuration of the CAD management information. As the CAD management information 143, a table in which items of, for example, execution machine name, machine IP address, process ID, tool name, CAD DB name, link to link list are associated may be used. The item of execution machine is a field for storing a name that identifies a device. The item of IP address is a field for storing an address allocated to the device. The item of process ID is a field for storing a unique identifier given to a process executed on the device. The item of tool name is a field for storing a name of a tool corresponding to the process ID. The item of CAD DB name is a field for storing a CAD DB name corresponding to the process ID. The item of link to link list is a field for storing an address of a link list indicating the linkable tool.

According to the example represented in FIG. 7, the device having the execution machine name of "APPLICATION SERVER A" is allocated with the machine IP address of "XXX.XXX.XXX.11". The tool name of the process ID of "PROCESS B" on the device having the execution machine name of "APPLICATION SERVER A" is "IMPLEMENTATION CAD". Furthermore, the CAD DB name of the process ID of "PROCESS B" on the device having the execution machine name of "APPLICATION SERVER A" is "DATA B". Furthermore, the address of the link list of the device having the execution machine mane of "CLIENT A" is "ADDRESS A".

FIG. 3 will be referred back here. The link list information 144 is information on link between CAD tools. For example, in the link list information 144, links to the CAD management information indicating the linkable CAD tool are stored.

Figure 8:
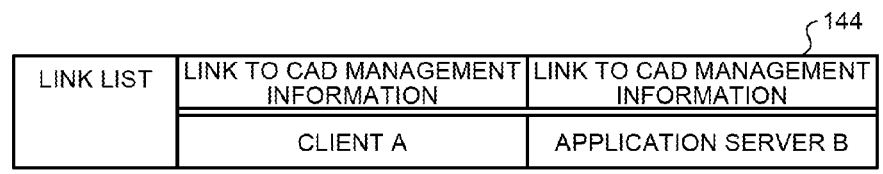
FIG. 8 is a table representing exemplary data configuration of link list information.

FIG. 8 is a table representing exemplary data configuration of the link list information. As the link list information 144, a table in which items of, for example, links to CAD management information are associated with each other may be used. According to FIG. 8, the address of the link list information 144 is an example of "ADDRESS A" indicated in FIG. 7. Each of items of link to CAD management information is a field for storing the name that identifies the linkable device. According to the example represented in FIG. 8, "CLIENT A" and "APPLICATION SERVER B" are linkable.

FIG. 3 will be referred back here. The control unit 132 is a device that controls the portal 20. As the control unit 132, an electronic circuit, such as a CPU or a MPU, or an integrated circuit, such as an ASIC or a FPGA, may be used. The control unit 132 includes an internal memory for storing programs that define various processing procedures and control data and executes various processes according to the programs and the control data. The control unit 132 functions as various processing units by running the various programs. For example, the control unit 132 includes a receiving unit 150, a storing unit 151, an allocation unit 152, a transmitting unit 153, and a setting unit 154.

The receiving unit 150 is a processing unit that receives various types of information. For example, the receiving unit 150 receives terminal information relating to the client 12 from the client 12. For example, the terminal information is client machine information and CAD information. The client machine information is the machine name of the client 12, the IP address of the client machine, etc. The CAD information is the tool name, process ID, CAD DB name, etc. The receiving unit 150 receives a connection request from the client 12. The receiving unit 150 receives the CAD DB of the implementation design CAD tool from the client 12. The receiving unit 150 receives the CAD DB from the client 12. The receiving unit 150 receives information of a request for the linkable CAD tool that is linkable with the circuit design CAD tool and the CAD DB from the client 12. The receiving unit 150 receives, from the client 12, information on the the linkable CAD tool and CAD DB selected by the user. The receiving unit 150 receives operation information from the client 12.

The storing unit 151 is a processing unit that stores various types of information in the storage unit 131. For example, the storing unit 151 stores client machine information and CAD information received from the client 12 in the CAD management information 143. For example, the storing unit 151 stores the client machine information and the CAD information in the CAD management information 143 corresponding to the account of the authenticated user. The storing unit 151 stores information on the application server in the application server information 140. The storing unit 151 stores the information on the file server in the file server information 141. The storing unit 151 stores the information relating to the CAD tool to be linked, which is received from the client 12, in the link list information 144.

The allocation unit 152 is a processing unit that allocates servers. Specifically, when the receiving unit 150 receives a CAD DB, the allocation unit 152 allocates an application server 21 that starts the tool corresponding to the CAD DB. For example, when the CAD DB of the implementation design CAD tool is received, the allocation unit 152 allocates an application server 21 that starts the implementation design CAD tool. For example, the allocation unit 152 allocates the application server whose performance matches the load of running the CAD tool.

The transmitting unit 153 is a processing unit that transmits various types of information. For example, according to the terminal information received by the receiving unit 150, the transmitting unit 153 transmits link information relating to the implementation design CAD tool linkable with the circuit design CAD tool to the client 12. For example, the transmitting unit 153 transmits a table for the user to select a linkable tool as the link information. The transmitting unit 153 transmits an authentication notice to the connection request from the client 12. The transmitting unit 153 notifies the client 12 that the terminal information has been saved and preparation has been completed. The transmitting unit 153 transmits the CAD DB received from the client 12 to the file server 22. The transmitting unit 153 issues a notification representing that preparation of starting the CAD tool has been completed. The transmitting unit 153 issues a notification representing that the link between CAD tools has started. The transmitting unit 153 transmits operation information to the application server 21. The transmitting unit 153 transmits the result screen received from the application server 21 to the client 12.

The setting unit 154 is a processing unit that sets a CAD tool to be linked. Specifically, according to the link information transmitted from the transmitting unit 153, the setting unit 154 sets, as a server that communicates with the client 12, the application server 21 on which the implementation design CAD tool selected by the user who uses the client 12 runs. For example, the setting unit 154 sets the application server 21 on which the tool selected by the designer from among the linkable tools indicated on the table runs.

Configuration of Application Server

Figure 9:
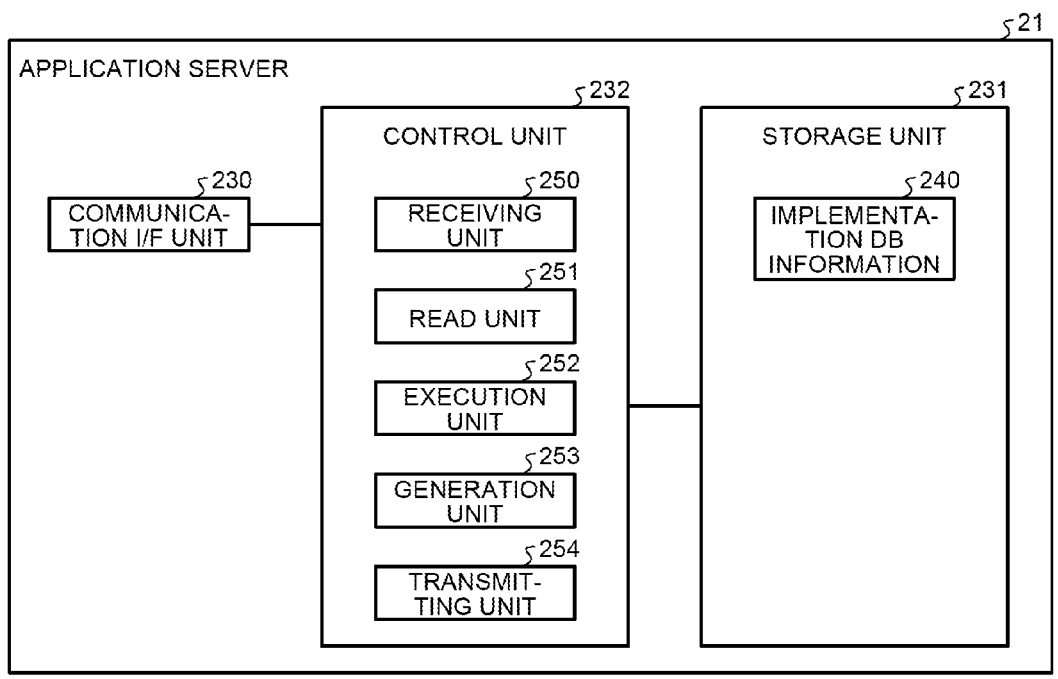
FIG. 9 is a diagram illustrating an exemplary functional configuration of an application server.

The application server 21 according to the first embodiment will be described below. FIG. 9 is a diagram illustrating an exemplary functional configuration of the application server. As illustrated in FIG. 9, the application server 21 includes a communication I/F unit 230, a storage unit 231, and a control unit 232.

The communication I/F unit 230 is an interface that performs communication control between the application server 21 and other devices. The communication I/F unit 230 transmits/receives various types of information to/from other devices via the network 11. For example, the communication I/F unit 230 receives various types of information relating to CAD from the client 12, the portal 20, and the file server 22. As the communication I/F unit 230, a network interface card, such as a LAN card, may be used.

The storage unit 231 is a storage device, such as a semiconductor memory device, such as a flash memory, a hard disk, or an optical disk. The storage unit 231 may be a data-rewritable semiconductor memory, such as a RAM, flash memory, or an NVSRAM.

The storage unit 231 stores an OS executed by the control unit 232 and various programs for processing received requests. The storage unit 231 further stores various types of data used for the programs executed by the control unit 232. For example, the storage unit 231 stores implementation DB information 240.

The implementation DB information 240 is various types of data, such as design data and various types of setting information. For example, in the implementation DB information 240, the CAD DB received from the client 12 via the portal 20 is stored.

The control unit 232 is a device that controls the application server 21. As the control unit 232, an electronic circuit, such as a CPU or a MPU, or an integrated circuit, such as an ASIC or an FPGA, may be used. The control unit 232 includes an internal memory for storing programs that define various processing procedures and control data and executes various processes according to the programs and control data. The control unit 232 functions as various processing units by running the various programs. For example, the control unit 232 includes a receiving unit 250, a read unit 251, an execution unit 252, a generation unit 253, and a transmitting unit 254.

The receiving unit 250 is a processing unit that receives various types of information. For example, the receiving unit 250 receives operation information transmitted by the transmitting unit 51 of the client 12. The receiving unit 250 receives information relating to allocation to the file server 22, an instruction for starting the CAD tool, an instruction for reading the CAD DB, etc. from the portal 20. The receiving unit 250 receives the CAD DB from the file server 22. The receiving unit 250 may receive various types of information via the portal 20. For example, the receiving unit 250 may receive operation information from the client 12 via the portal 20.

The read unit 251 is a processing unit that reads various types of information. For example, when an instruction for reading the CAD DB is received from the portal 20, the read unit 251 reads the CAD DB corresponding to the CAD tool to be started from the file server 22.

The execution unit 252 is a processing unit that executes various processes. For example, the execution unit 252 executes an operation of the implementation design CAD tool corresponding to the operation information received by the receiving unit 250. For example, the execution unit 252 executes various types of operations of the implementation design CAD tool, such as searching for and selecting parts, etc., highlighted display, and zooming in on the screen.

The generation unit 253 is a processing unit that generates various types of information. For example, the generation unit 253 generates a result screen representing the result of operating the implementation design CAD tool according to the operation information received by the receiving unit 250. For example, the generation unit 253 generates a result screen representing the result of operating various operations of the implementation design CAD tool, such as searching for and selecting parts, etc., highlighted display, and zooming in on the screen.

The transmitting unit 254 is a processing unit that transmits various types of information. For example, the transmitting unit 254 transmits the result screen generated by the generation unit 253. For example, the transmitting unit 254 transmits the result screen resulting from operating the implementation design CAD tool according to the operation information on the circuit design CAD tool. The transmitting unit 254 may transmit various types of information to the client 12 via the portal 20. For example, the transmitting unit 254 transmits the result screen to the client 12 via the portal 20. The transmitting unit 254 notifies the portal 20 that starting the CAD tool has completed.

Running System

Figure 10:
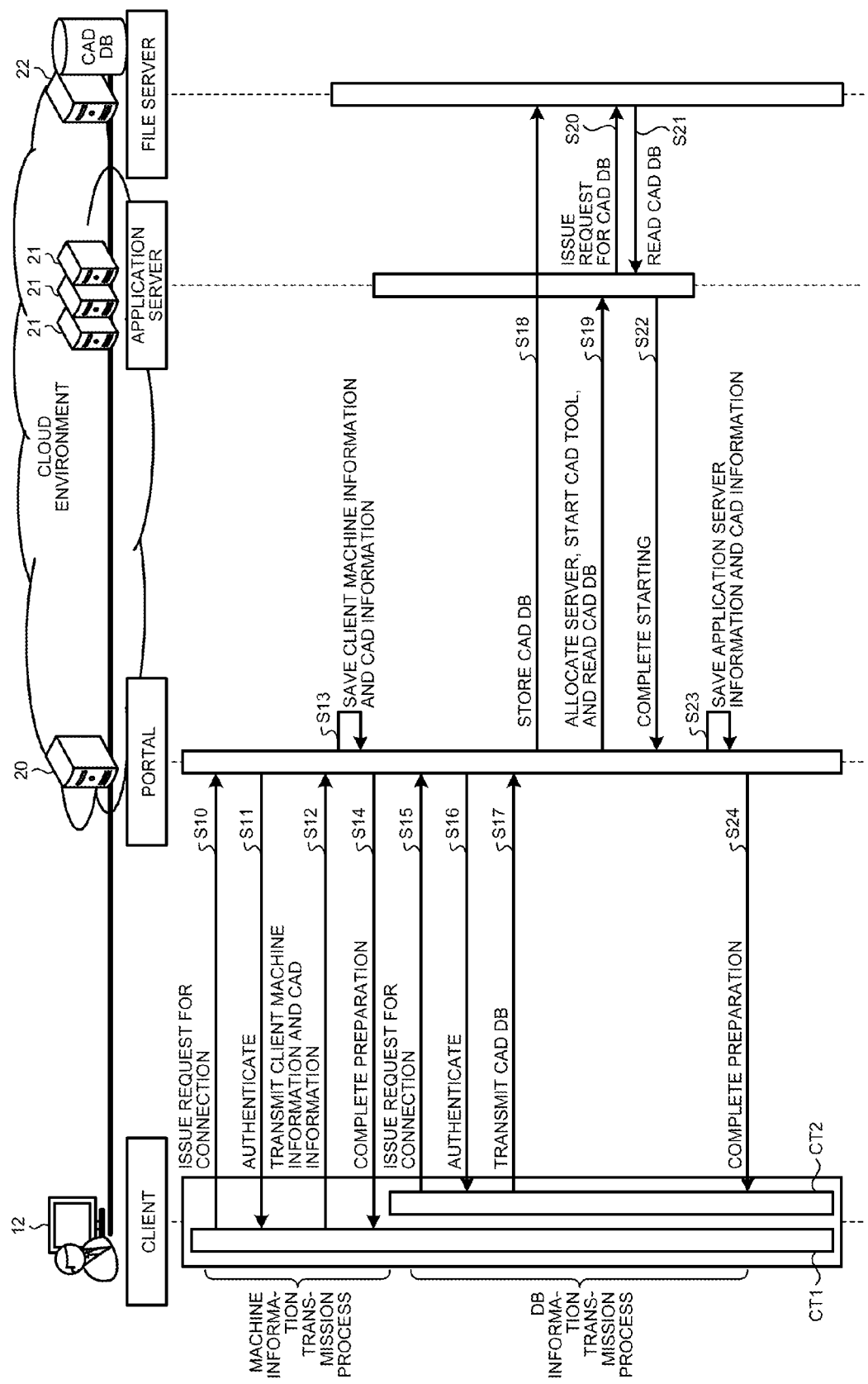
FIG. 10 is a sequence chart illustrating an exemplary link establishment process performed by the link system.

A description will be provided below for running processes, performed by the link system 1 according to the first embodiment, of linking a circuit design CAD tool CT1 that is installed in the client 12 with an implementation design CAD tool CT2 installed in the application server 21 and used via the web browser. First, running the link system 1 according to the first embodiment to establish a link between the circuit design CAD tool CT1 and the implementation design CAD tool CT2 will be described. FIG. 10 is a sequence chart illustrating an exemplary link establishment process performed by the link system.

A machine information transmission process (S10 to S14) of transmitting the information on the client 12 will be described. The designer accesses the portal 20 by using the circuit design CAD tool CT1 of the client 12 to make a request for a connection (S10). The portal 20, for example, displays a login screen to cause the designer to input the user ID, the password, etc., and performs user authentication. When the user is authenticated, the portal 20 makes a notification representing that the user is authenticated (S11) and makes the design support service available.

The designer then uses the client 12 to transmit the client machine information and the CAD information, which are the terminal information, to the portal 20 (S12). The portal 20 stores the received client machine information and the CAD information in the CAD management information 143 corresponding to the account of the user (S13). FIG. 11 is an explanatory view for explaining the process of storing in the CAD management information. For example, as represented in FIG. 11, the portal 20 stores, in the CAD management information 143, the execution machine name of "CLIENT A" and the machine IP address of "XXX.XXX.XXX.01" as the client machine information received from the client 12. The portal 20 stores, as the CAD information received from the client 12, the process ID of "PROCESS A", the tool name of "CIRCUIT CAD", and the CAD DB name of "DATA A" in the CAD management information 143.

FIG. 10 will be referred back here. The portal 20 then notifies the circuit design CAD tool installed in the client 12 that the client machine information and the CAD information has been saved and preparation has completed (S14). Accordingly, the machine information transmission process completes.

A DB information transmission process (S15 to S24) will be described here. The designer accesses the portal 20 by using the web browser of the client 12 to make a request for a connection (S15). The portal 20 performs user authentication and, when the user is authenticated, makes a notification representing that the user is authenticated (S16) and make the design support service available.

The client 12 starts the implementation design CAD tool CT2 of the application server 21 via the web browser. The client 12 transmits the CAD DB of the implementation design CAD tool CT2 to the portal 20 (S17). The portal 20 transmits the CAD DB received from the client 12 via the web browser to the file server 22. Accordingly, the file server 22 stores the CAD DB in the implementation DB information 240 (S18).

The portal 20 allocates an application server 21 and issues, to the application server 21, an instruction for starting the CAD tool and reading the CAD DB (S19). For example, the portal 20 allocates an application server 21 that starts the CAD tool by using the CAD DB stored in the file server 22.

The allocated application server 21 starts the CAD tool and issues a request for the CAD DB to the file server 22 (S20). The application server 21 receives the CAD DB from the file server 22 and reads the CAD DB (S21). Accordingly, a designing environment for the designer to perform circuit designing is constructed in the application server 21.

When reading the CAD DB has completed, thus the designing environment has been constructed and thus the starting has completed, the application server 21 transmits the CAD information (the tool name, the process ID, the CAD DB name) to the portal 20 and makes a notification representing that the starting has completed (S22).

Upon receiving the notification representing that the starting has completed from the application server 21, the portal 20 saves the application server information and the CAD information (S23). Specifically, the portal 20 saves the information on the allocated application server 21 and the CAD information transmitted from the application server 21 in the CAD management information 143 associated with the authenticated user. FIG. 12 is an explanatory view for explaining the process of storing in the CAD management information. For example, as represented in FIG. 12, the portal 20 stores the execution machine name of "APPLICATION SERVER B" and the machine IP address of "XXX.XXX.XXX.12" allocated to the application server 21 in the CAD management information 143. The portal 20 stores the process ID of "PROCESS C", the tool name of "IMPLEMENTATION CAD", and the CAD DB name of "DATA C" in the CAD management information 143 as the CAD information received from the client 12.

FIG. 10 will be referred back here. The portal 20 notifies the client 12 that the DB information transmission process has completed and the preparation has completed (S24). Accordingly, the DB information transmission process ends. According to the example illustrated in FIG. 10, the machine information transmission process is performed and then the DB information transmission process is performed. Alternatively, the DB information transmission process may be performed before the machine information transmission process.

Figure 13:
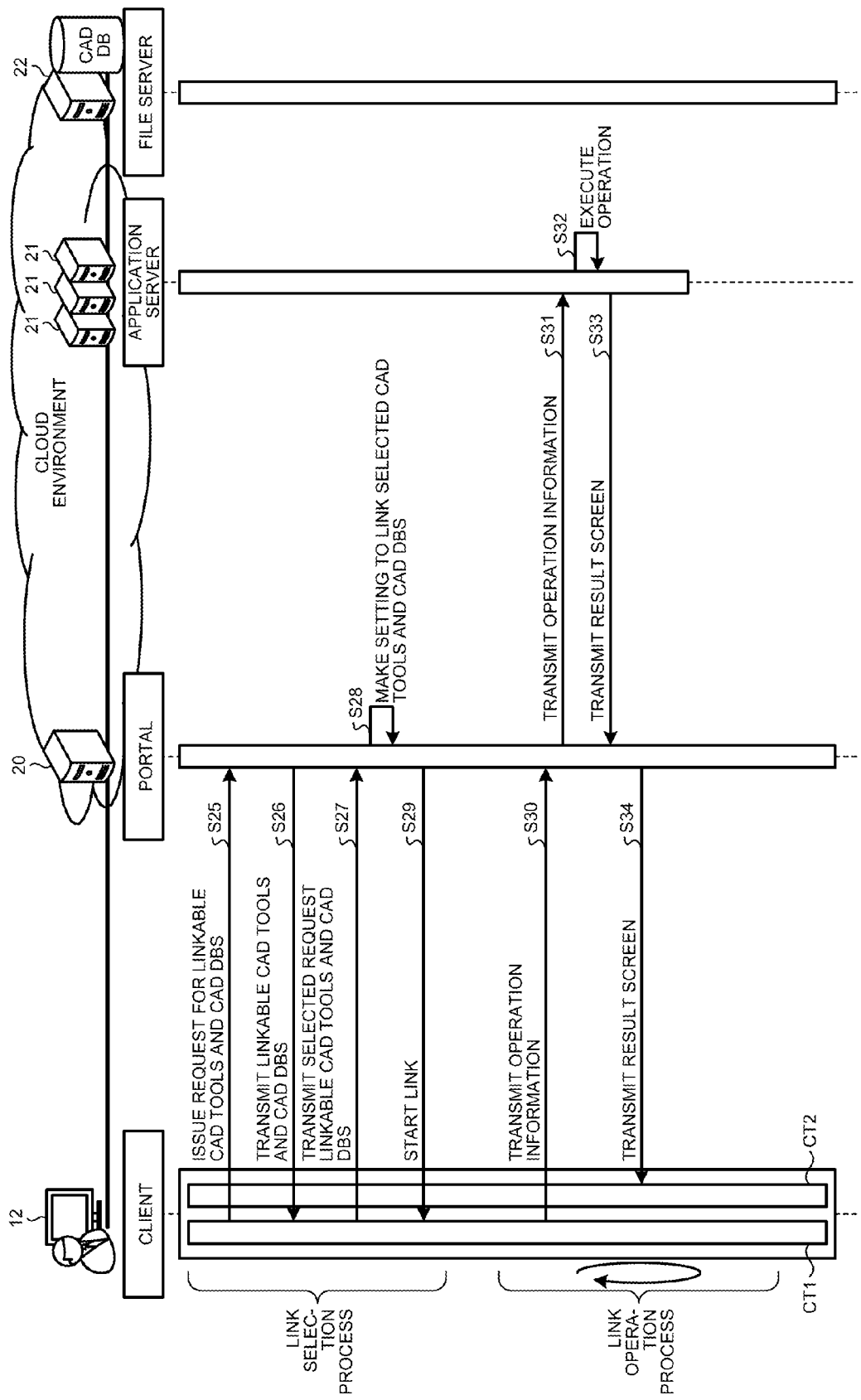
FIG. 13 is a sequence chart illustrating an exemplary link operation process performed by the link system.

A description will be given below for running the link system 1 according to the first embodiment to link the operation of the circuit design CAD tool CT1 and the operation of the implementation design CAD tool CT2 with each other. FIG. 13 is a sequence chart illustrating an exemplary link operation process performed by the link system.

First, a link selection process (S25 to S29) of selecting a CAD tool to be linked will be described. The designer uses the circuit design CAD tool CT1 of the client 12 to issue a request for information on linkable CAD tools and CAD DBs to the portal 20 (S25). For example, the designer issues a request for the information on linkable CAD tools and CAD DBs by starting a CAD tool link function command of the circuit design CAD tool CT1 installed in the client 12.

The portal 20 transmits the information on linkable CAD tools and CAD DBs in response to the request from the client 12 (S26). Specifically, the portal 20 transmits the tool names of unlinked CAD tools and CAD DB names. For example, upon receiving the request from the client 12, the portal 20 refers to the the CAD management information 143 and transmits the tool names having no link to link list and the CAD DB names to the client 12.

The designer then refers to the information on linkable CAD tools and CAD DBs and selects CAD tools to be linked. FIG. 14 is a diagram depicting an exemplary selection screen. For example, the circuit design CAD tool CT1 generates the table Ta1 represented in FIG. 14 according to the information on linkable CAD tools and CAD DBs. The table Ta1 represents "ACCOUNT", "TOOL NAME", and "CAD DB NAME" of linkable CAD tools in association with one another. The table Ta1 is provided with tick boxes in the "LINK" section for selecting tools to be linked. The circuit design CAD tool CT1 generates a selection screen Wi1 on which the table Ta1 is displayed and displays the selection screen Wi1 on the display unit 33. The designer then selects CAD tools to be linked by ticking tick boxes in the "LINK" section on the table Ta1. According to the example represented in FIG. 14, the tools having the names of "CIRCUIT CAD" and "IMPLEMENTATION CAD" are selected as tools to be linked. According to the example represented in FIG. 14, "-" in the "ACCOUNT" section represents that the account is the same as that of the user of the CAD tool installed in the client 12. The client 12 transmits the information on the CAD tools and the CAD DBs selected by the designer to the portal 20 (S27).

Figure 15:
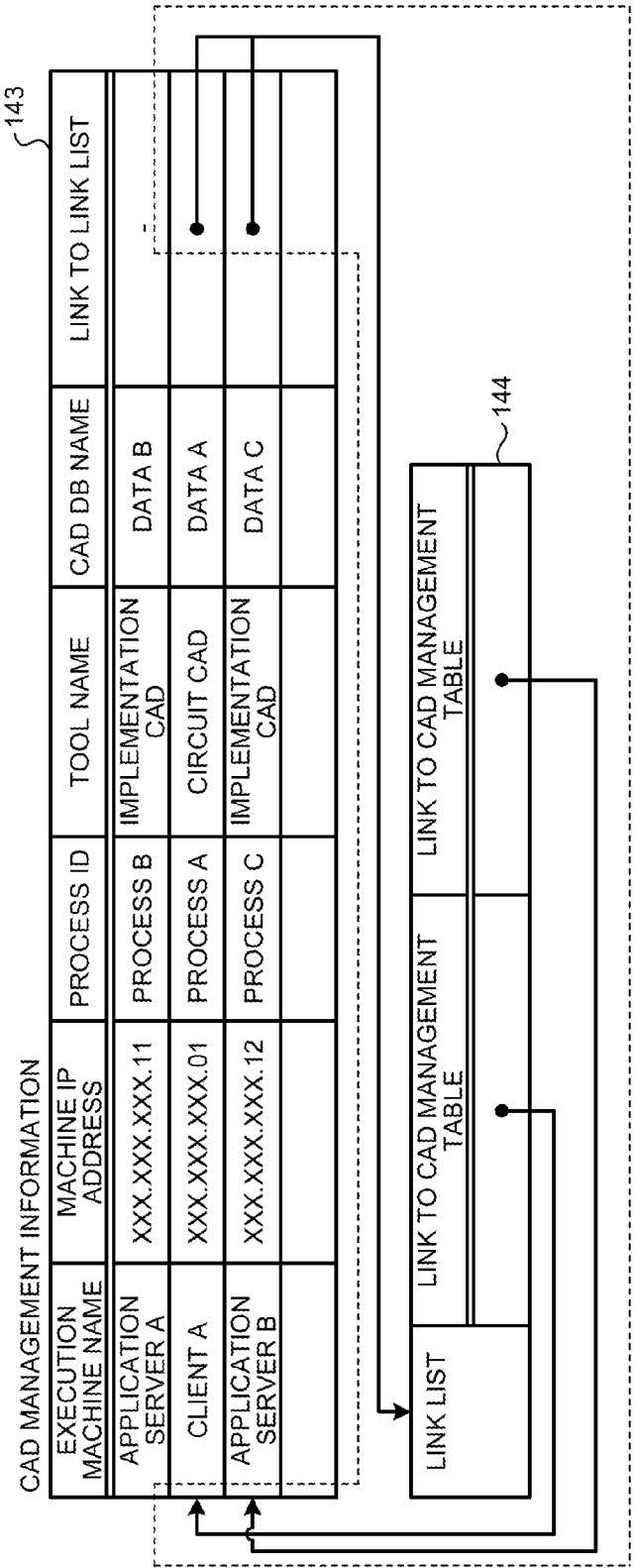
FIG. 15 is an explanatory view for explaining a link process.

The portal 20 then makes a setting to link the CAD tools and the CAD DBs that are selected (S28). FIG. 15 is an explanatory view for explaining a process of linking tools. For example, as illustrated in FIG. 15, the portal 20 generates a link list linked from the selected CAD tools and CAD DBs to the corresponding rows in the CAD management information 143 and provides a link from the corresponding rows in the CAD management information 143 to the link list. For example, the link is provided by storing "ADDRESS A" that is the address of the link list information 144 in "LINK TO LINK LIST" of "CLIENT A" AND "APPLICATION SERVER B".

After making a setting to link the selected CAD tools and the CAD DBs, the portal 20 transmits a notification representing that the link between the selected tools has started to the client 12 (S29). For example, the portal 20 notifies the circuit design CAD tool installed in the client 12 of the notification. Accordingly, the link selection process ends.

The link operation process (S30 to S34) of linking the operation of the circuit design CAD tool CT1 with the operation of the implementation design CAD tool CT2 will be described below. The designer uses the client 12 to perform various operations relating to the circuit design CAD tool CT1. The client 12 accepts operation information for operating the circuit design CAD tool CT1. The client 12 then transmits the operation information to the portal 20 (S30). For example, the client 12 transmits operation information on functions linkable between CAD tools (X-probe), such as searching for and selecting parts, etc., highlighted display, and zooming in/out on the display screen in the circuit design CAD tool CT1. For example, the client 12 transmits, as operation information, data items, such as the operation content of "SELECT", the target element of "PART", and the element name of "XXXXXX".

Figure 16:
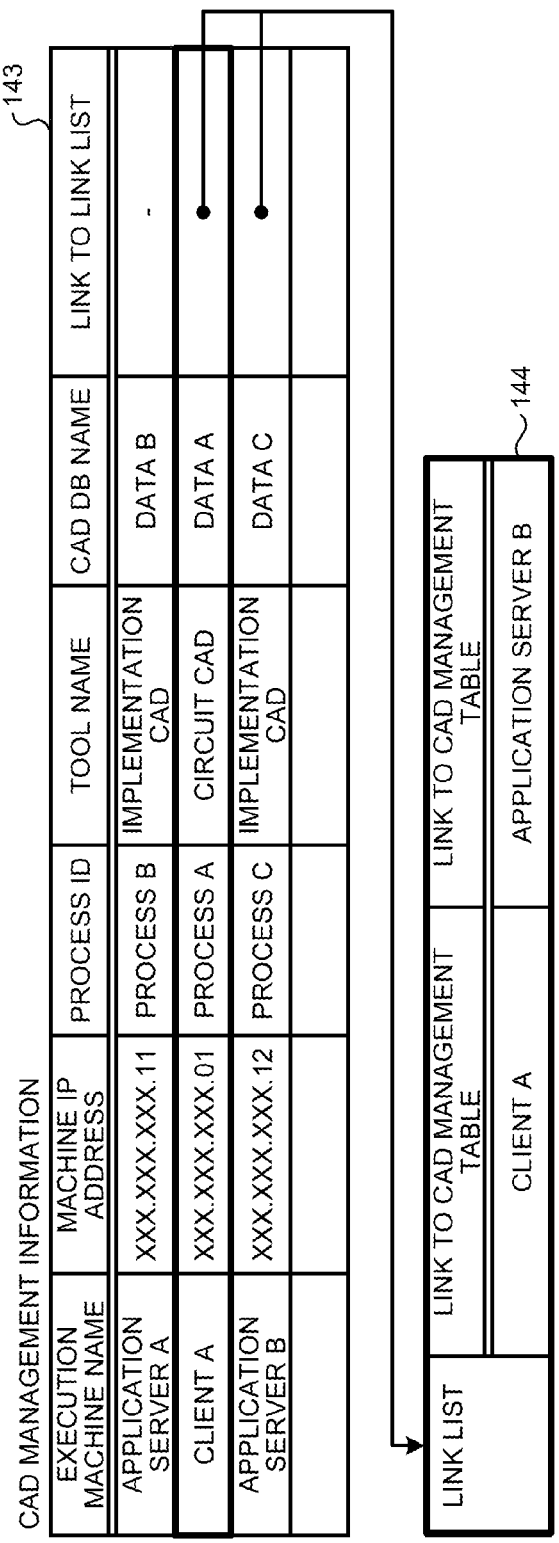
FIG. 16 is an explanatory view for explaining a process of reading a link list.
Figure 17:
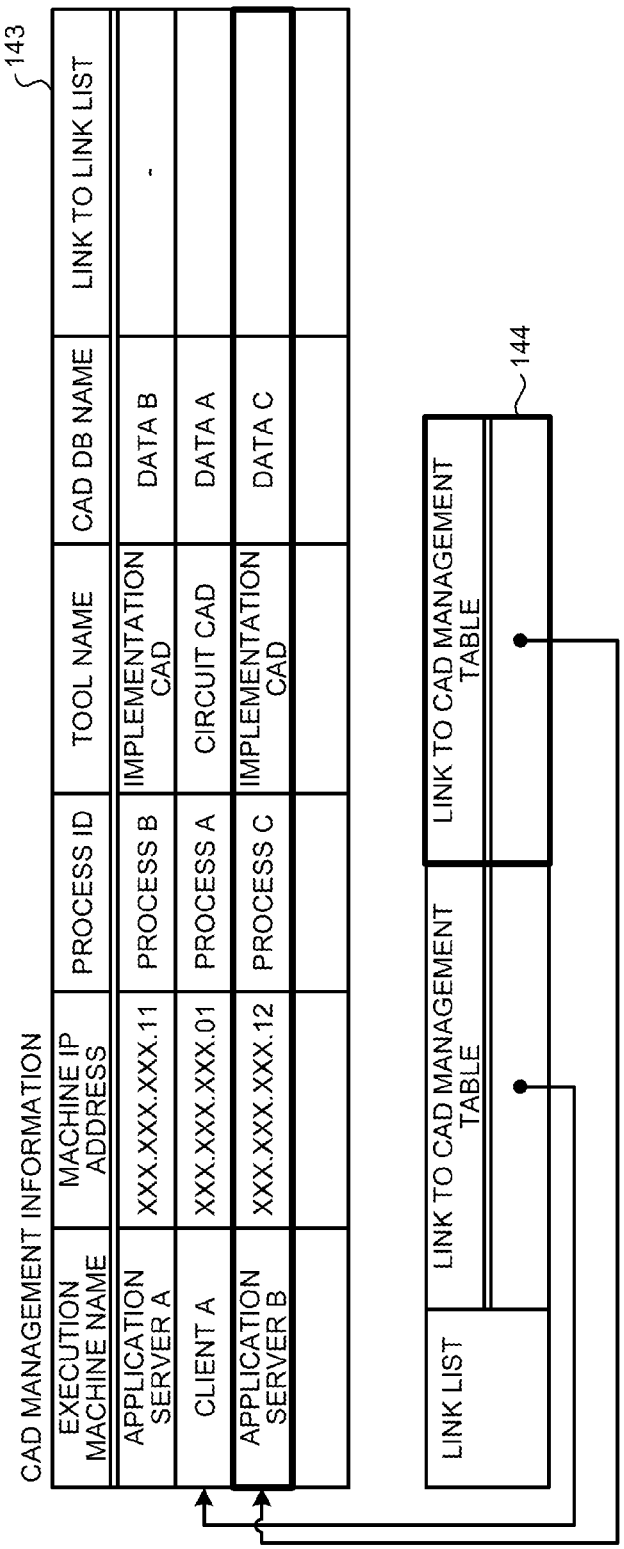
FIG. 17 is an explanatory view for explaining a process of transmitting operation information.

The portal 20 receives the operation information from the client 12. The portal 20 then transmits the received operation information to the application server 21 (S31). Specifically, the portal 20 transmits the operation information to the application server 21 in which the CAD tool selected by the link selection process is installed. For example, the portal 20 first reads the link list corresponding to the row of the CAD tool and the CAD DB of the machine corresponding to the client 12 that has transmitted the operation information. FIG. 16 is an explanatory view for explaining a process of reading a link list. According to the example illustrated in FIG. 16, the portal 20 reads the link to link list corresponding to "CLIENT A" that has transmitted the operation information. The portal 20 refers to the link list information 144 and transmits the operation information to the machine other than the machine that has transmitted the operation information. FIG. 17 is an explanatory view for explaining a process of transmitting operation information. According to the example illustrated in FIG. 17, the portal 20 first refers to the link list information 144 and extracts "APPLICATION SERVER B" as a machine other than "CLIENT A" that is the machine having transmitted the operation information from among the link list information 144. The portal 20 then transmits the operation information to the application server 21 corresponding to the extracted "APPLICATION SERVER B".

The application server 21 receives the operation information from the portal 20. In other words, the application server 21 receives the operation information from the client 12 via the portal 20. The application server 21 then executes the operation of the implementation design CAD tool CT2 according to the received operation information (S32).

According to the received operation information, the application server 21 generates a result screen representing the result of operating the implementation design CAD tool CT2 according to the received operation information. The application server 21 then transmits the generated result screen to the portal 20 (S33). The portal 20 then receives the result screen from the application server 21. The portal 20 then transits the received result screen to the client 12 (S34). In other words, the application server 21 transmits the result screen to the client 12 via the portal 20. The client 12 then receives the result screen from the portal 20. Accordingly, the client 12 displays the received result screen on the display unit 33. For example, the client 12 displays the result screen on a screen for the implementation design CAD tool CT2.

Flow of Process

Figure 18:
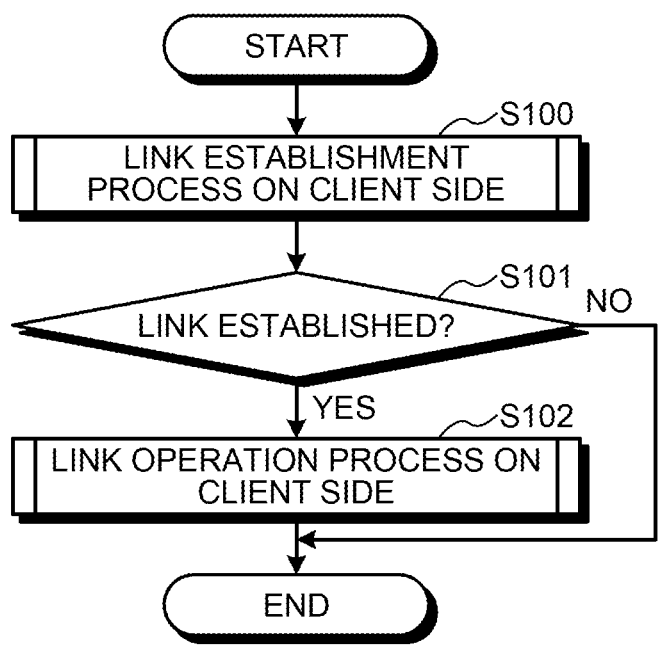
FIG. 18 is a flowchart illustrating an exemplary procedure of a link process on the side of the client.

The flow of the relay process performed by the link system 1 according to the first embodiment will be described below. First, the flow of the link process performed by the client 12 will be described first. FIG. 18 is a flowchart illustrating an exemplary procedure of the link process on the side of the client. The link process is executed at a predetermined timing, e.g., the timing at which a request is received first after the client 12 is started.

As illustrated in FIG. 18, the client 12 executes the link establishment process on the side of the client 12 (S100), which will be described below. The client 12 then determines whether the link establishment process has completed (S101). When the link establishment process has not completed (NO at S101), the client 12 ends the process. On the other hand, when the link establishment process has completed (YES at S101), the client 12 executes the link operation process (S102). The client 12 then ends the process.

Figure 19:
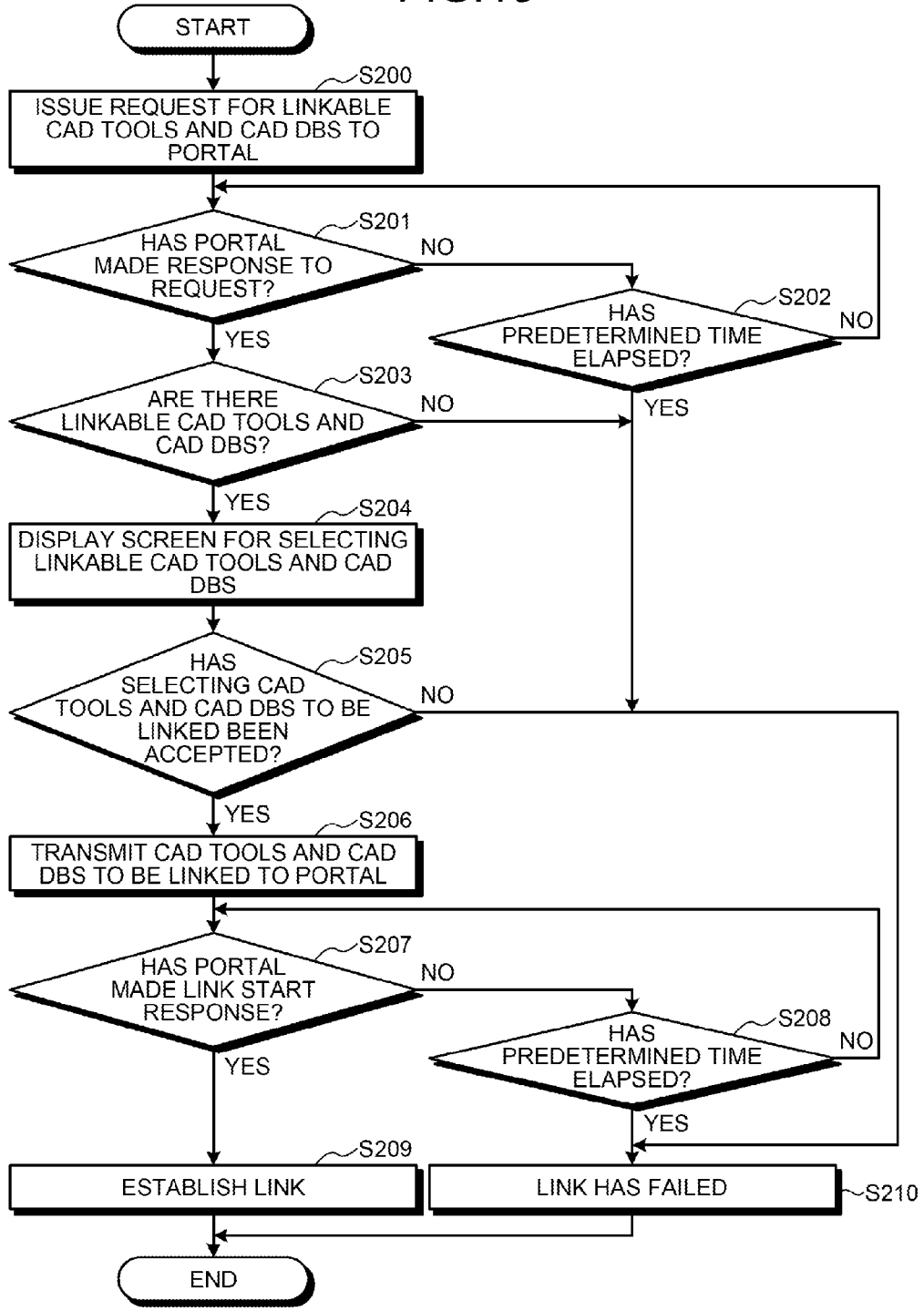
FIG. 19 is a flowchart illustrating an exemplary procedure of a link establishment process on the side of the client.

The link establishment process on the side of the client will be described in detail here. FIG. 19 is a flowchart illustrating an exemplary procedure of the link establishment process on the side of the client. As illustrated in FIG. 19, the client 12 issues a request for the information on linkable CAD tools and CAD DBs to the portal 20 (S200). The client 12 then determines whether the portal 20 has made a response to the request (S201). When no response has been made (NO at S201), the client 12 determines whether a predetermined time has elapsed (S202). When the predetermined time has not elapsed (NO at S202), the client 12 waits until the portal 20 makes a response. When the predetermined time has elapsed (YES at S202), the client 12 makes a display representing that the link has failed (S210) and ends the process.

When a response has been made (YES at S201), the client 12 determines whether there are linkable CAD tools and CAD DBs (S203). When the client 12 determines that there are no linkable CAD tools and CAD DBs (NO at S203), the client 12 makes a display representing that the link has failed (S210) and end the process. On the other hand, when the client 12 determines that there are linkable CAD tools and CAD DBs (YES at S203), the client 12 displays a screen for selecting linkable CAD tools and CAD DBs (S204).

The client 12 then determines whether selecting CAD tools and CAD DBs to be linked has been accepted (S205). When no selecting has been accepted (NO at S205), the client 12 makes a display representing that the link has failed (S210) and ends the process. On the other hand, when the selecting has been accepted (YES at S205), the client 12 transmits the information on the CAD tools and CAD DBs to be linked to the portal 20 (S206).

The client 12 then determines whether the portal 20 has made a response representing that the link has started (S207). When the portal 20 has made the response (YES at S207), the client 12 completes the relay establishment (S209) and ends the process. On the other hand, no response has been made (NO at S207), the client 12 determines whether a predetermined time has elapsed (S208). When the predetermined time has not elapsed (NO at S208), the client 12 waits until the portal 20 makes a response. When the predetermined time has elapsed (YES at S208), the client 12 makes a display representing that the link has failed (S210) and ends the process.

Figure 20:
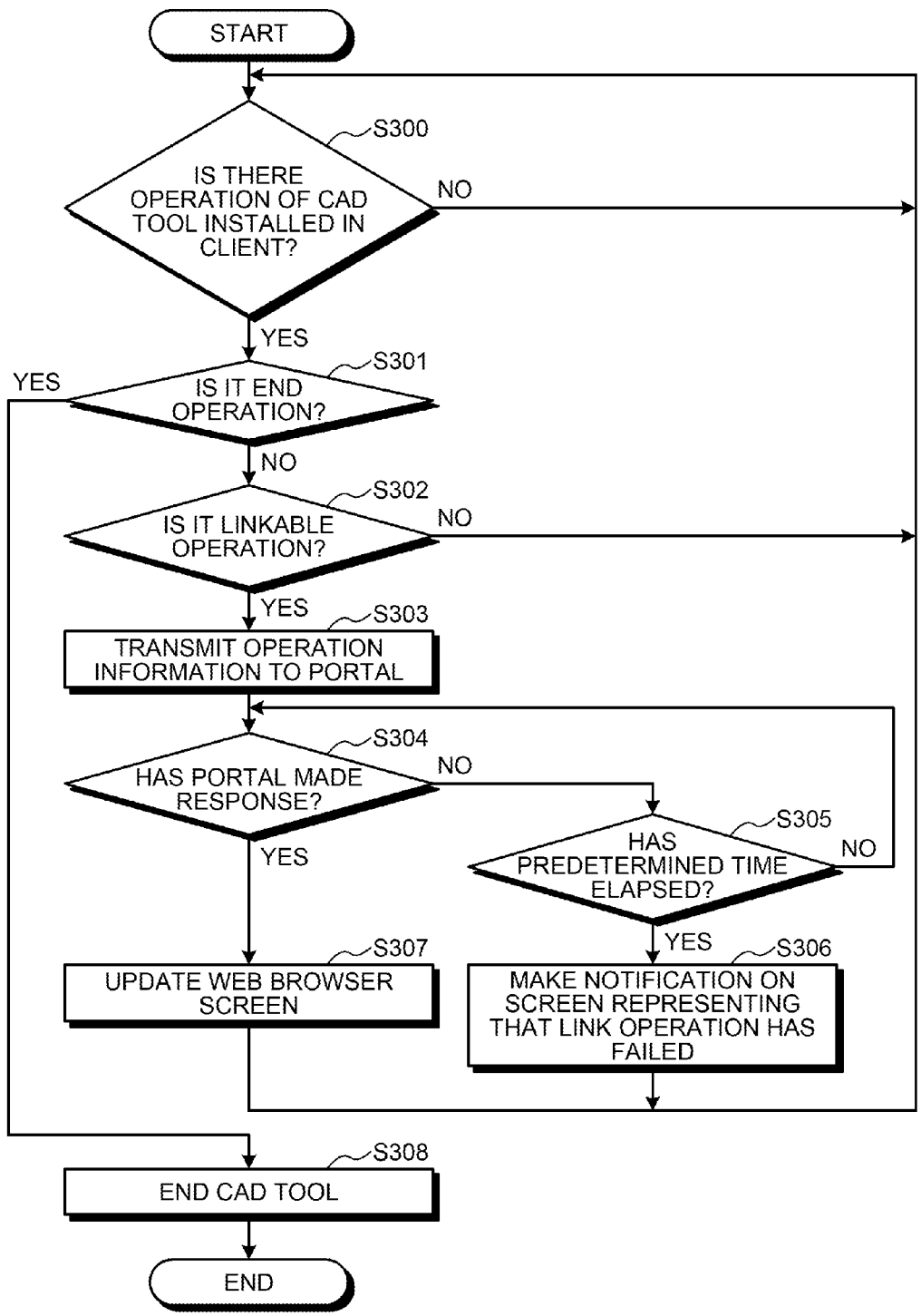
FIG. 20 is a flowchart illustrating an exemplary procedure of a link operation process on the side of the client.

The link operation process on the side of the client will be described in detail below. FIG. 20 is a flowchart illustrating an exemplary procedure of a link operation process on the side of the client. As illustrated in FIG. 20, the client 12 determines whether there is an operation on the circuit design CAD tool installed in the client 12 (S300). When there is no operation (NO at S300), the client 12 waits until the next operation is performed. When there is an operation (YES at S300), the client 12 determines whether the operation is an end operation (S301). When the operation is the end operation (YES at S301), the client 12 ends the circuit design CAD tool (S308).

When the operation is not the end operation (NO at S301), the client 12 determines whether the operation is a linkable operation (S302). When the operation is not a linkable operation (NO at S302), the client 12 waits until the next operation is performed. On the other hand, when the operation is a linkable operation (YES at S302), the client 12 transmits operation information for the operation to the portal 20 (S303).

The client 12 then determines whether the portal 20 has made a response (S304). When the portal 20 has made no response (NO at S304), the client 12 determines whether a predetermined time has elapsed (S305). When the predetermined time has not elapsed (NO at S305), the client 12 waits until the portal 20 makes a response. When the predetermined time has elapsed (YES at S305), the client 12 makes, on the screen, a notification representing that the link operation has failed (S306) and waits until the next operation is performed.

On the other hand, when the portal 20 has made a response (YES at S304), the client 12 updates the web browser screen that is the screen for the implementation design CAD tool (S307) and waits until the next operation is performed.

Figure 21:
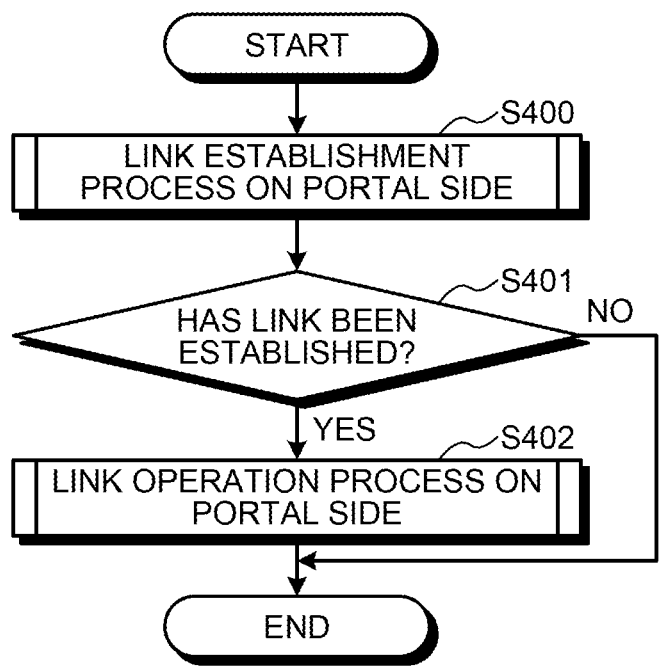
FIG. 21 is a flowchart illustrating an exemplary procedure of a link process on the side of the portal.

The flow of the relay process performed by the portal 20 will be described. FIG. 21 is a flowchart illustrating an exemplary procedure of the link process performed by the portal. The link process is executed at a predetermined timing, such as the timing at which a request is received from the client 12.

As illustrated in FIG. 21, the portal executes the link establishment process on the side of the portal 20, which will be described below (S400). The portal 20 then determines whether the link establishment process has completed (S401). When the link establishment process has not been completed (NO at S401), the portal 20 ends the process. On the other hand, when the link establishment process has been completed (YES at S401), the portal 20 executes the link operation process (S402), and then ends the process.

Figure 22:
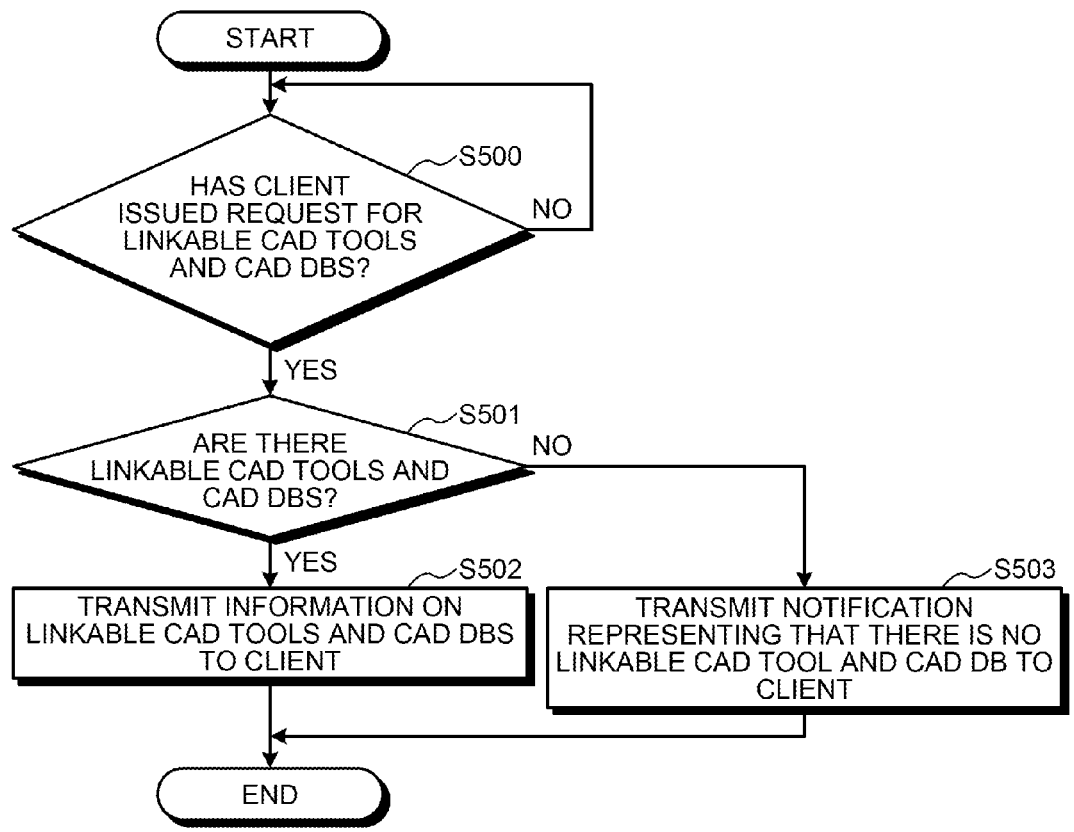
FIG. 22 is a flowchart illustrating an exemplary procedure of a link establishment process on the side of the portal.

The link establishment process on the side of the portal will be described in detail here. FIG. 22 is a flowchart illustrating an exemplary procedure of the link establishment process on the side of the portal. As illustrated in FIG. 22, the portal 20 determines whether the client 12 has issued a request on the information on linkable CAD tools and CAD DBs (S500). When no request has been made (NO at S500), the portal 20 waits until the client 12 issues a request. When the client 12 has made the request (YES at S500), the portal 20 determines whether there are likable CAD tools and CAD DBs (S501). When there are likable CAD tools and CAD DBs (YES at S501), the portal 20 transmits information on the linkable CAD tools and CAD DBs to the client 12 (S502) and ends the process. When there are no likable CAD tools and CAD DBs (NO at S501), the portal 20 transmits a notification representing that there are no likable CAD tools and CAD DBs to the client 12 (S503) and ends the process.

Figure 23:
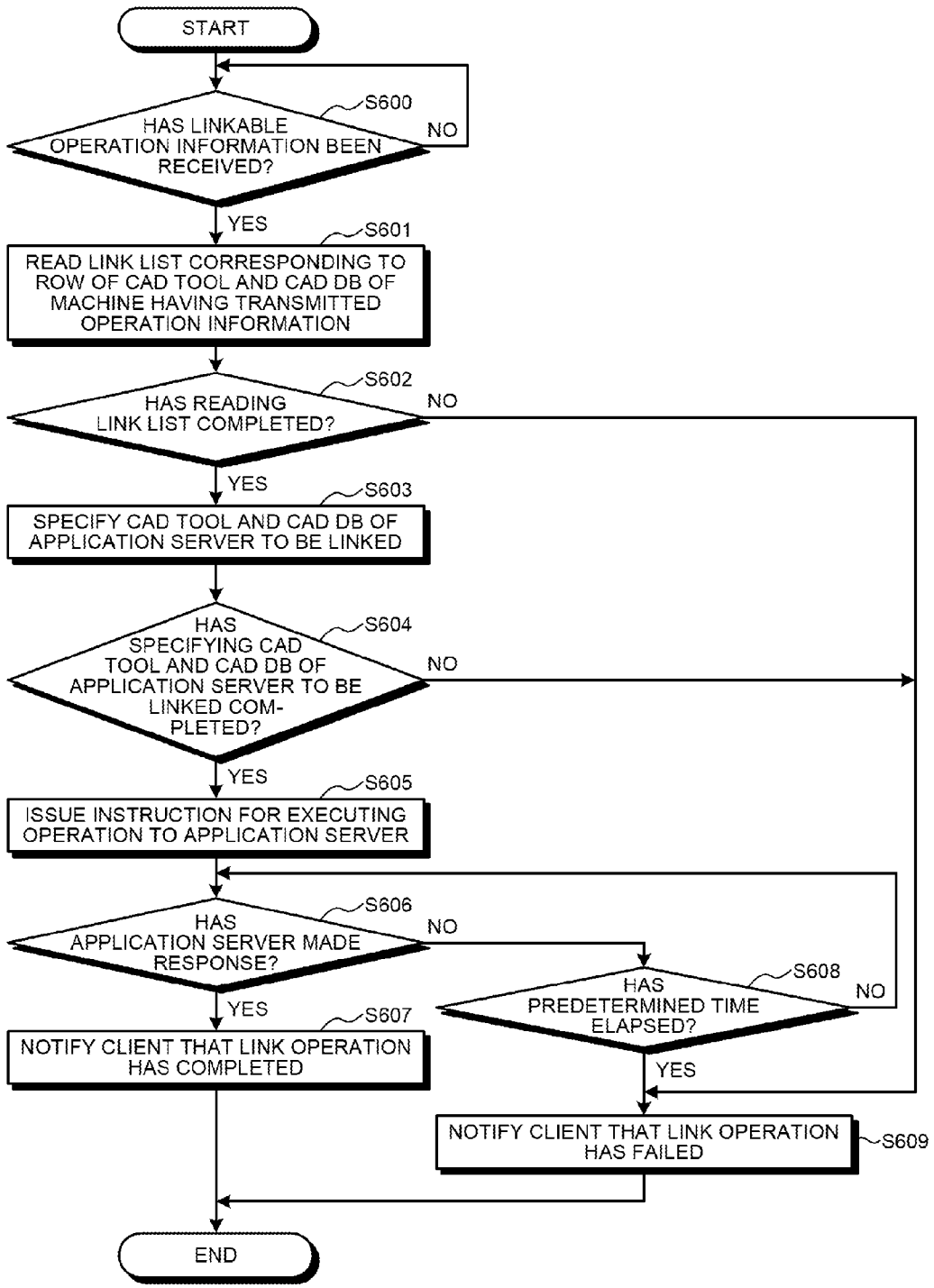
FIG. 23 is a flowchart illustrating an exemplary procedure of a link operation process on the side of the portal.

The link operation process on the side of the portal will be described in detail here. FIG. 23 is a flowchart illustrating an exemplary procedure of the link operation process on the side of the portal. As illustrated in FIG. 23, the portal 20 determines whether it has received linkable operation information from the client 12 (S600). When no linkable operation information has been received (NO at S600), the portal 20 waits until it receives operation information. When the portal 20 has received operation information (YES at S600), the portal 20 reads the link list corresponding to the row of the CAD tool and the CAD DB of the machine that has transmitted the operation information (S601).

The portal 20 then determines whether the reading has completed (S602). When the reading has failed (NO at S602), the portal 20 notifies the client 12 that the link operation has failed (S609) and ends the process. On the other hand, when the reading has been completed (YES at S602), the portal 20 refers to the link list and specifies the CAD tool and the CAD DB of the application server 21 to be linked (S603).

The portal 20 then determines whether the CAD tool and the CAD DB of the application server 21 to be linked have been specified (S604). When the CAD tool and the CAD DB have been specified (YES at S604), the portal 20 issues an instruction for executing the operation according to the operation information to the application server 21 (S605).

The portal 20 then determines whether the application server 21 has made a response (S606). When no response has been made (NO at S606), the portal 20 determines whether a predetermined time has elapsed (S608). When the predetermined time has not elapsed (NO at S608), the portal 20 waits until the application server 21 makes a response. When the predetermined time has elapsed (YES at S608), the portal 20 notifies the client 12 that the link operation has failed (S609) and ends the process.

On the other hand, when a response has been made (YES at S606), the portal 20 notifies the client 12 that the link operation has completed (S607) and ends the process.

Effect

As described above, the link system 1 according to the first embodiment includes the client 12 on which the circuit design CAD tool runs and the application server 21 on which the implementation design CAD tool linkable with the circuit design CAD tool runs. The client 12 accepts operation information for operating the circuit design CAD tool. The client 12 transmits the accepted operation information to the application server 21. The application server 21 receives the transmitted operation information. The application server 21 generates a result screen representing the result of operating the implementation design CAD tool according to the received operation information. The application server 21 transmits the generated result screen to the client 12. Accordingly, the link system 1 can link the tool running on the local terminal with the tool running on the server. For example, in the link system 1, because the operation of the implementation design CAD tool is performed when the operation of the circuit design CAD tool is executed, the load of operation performed by each of the tools can be reduced.

Figure 24:
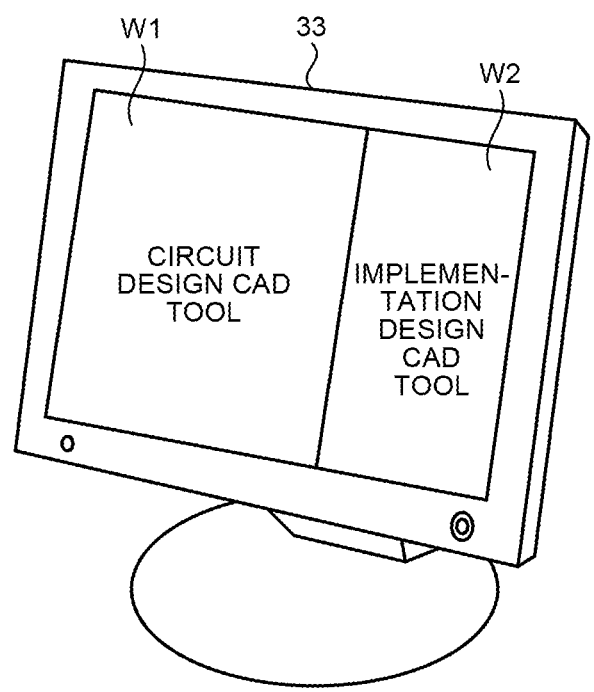
FIG. 24 is a diagram depicting an exemplary display unit.

The client 12 according to the first embodiment displays the result screen transmitted by the application server 21 on the screen for the implementation design CAD tool. Accordingly, the link system 1 can link the tool running on the local terminal and the tool running on the server and displays them together, which will be described with reference to FIG. 24. FIG. 24 is a diagram depicting an exemplary display unit. For example, as depicted in FIG. 24, the designer causes the display unit 33 to display a screen W1 for the circuit design CAD tool running on the client 12 and a screen W2 for the implementation design CAD tool provided by the cloud system 10 together. This allows the designer to check the screen W1 representing the result of operating the circuit design CAD tool and the screen W2 representing the result of operating the implementation design CAD tool at a time.

Figure 25:
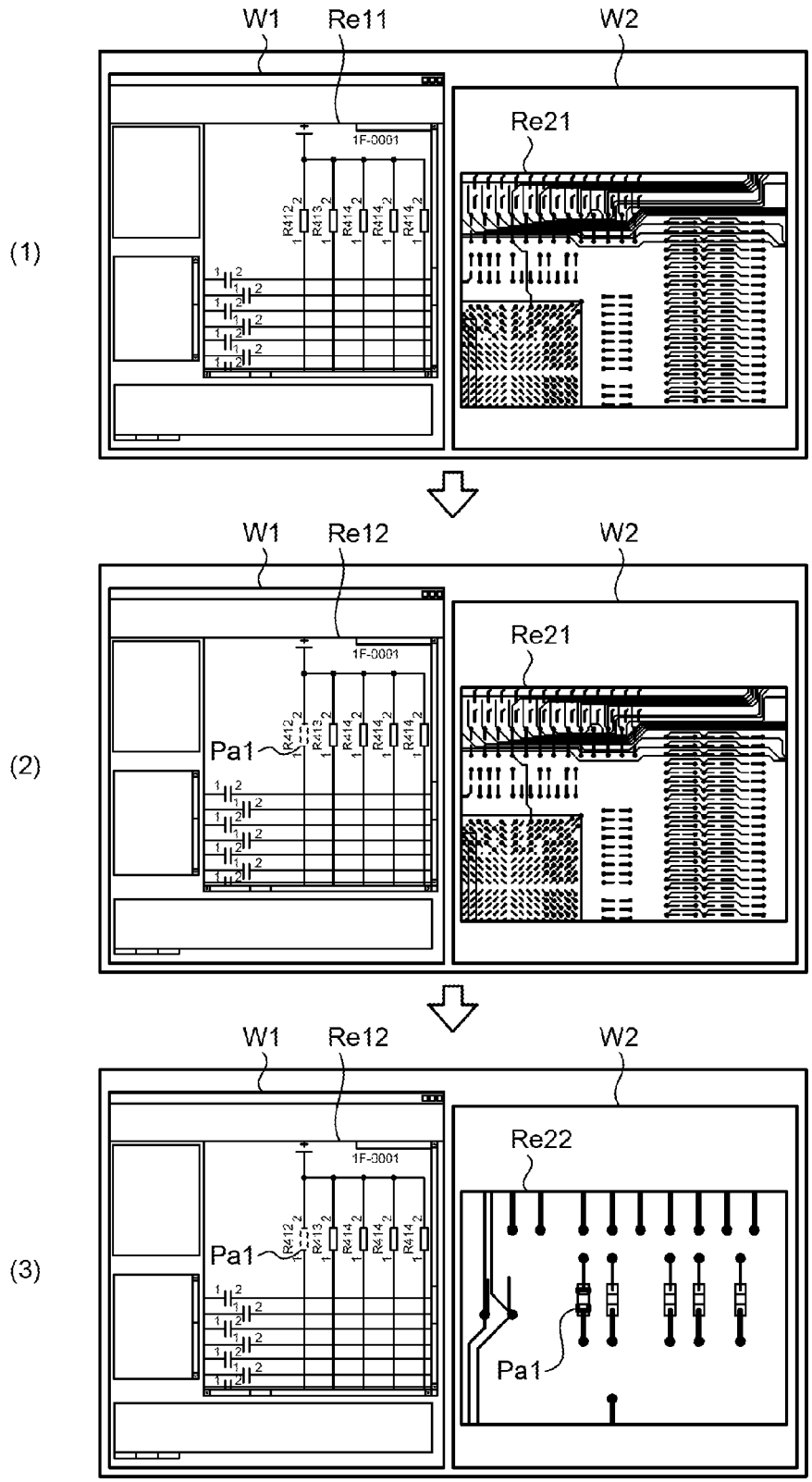
FIG. 25 is an explanatory view for explaining the effect of the link system.

This aspect will be described in detail with reference to FIG. 25. FIG. 25 is an explanatory view for explaining the effect of the link system 1. As illustrated in FIG. 25(1), the client 12 displays a result screen Re11 resulting from operating the circuit design CAD tool on the screen W1 for the circuit design CAD tool. The client 12 displays a result screen Re21 resulting from operating the implementation design CAD tool on the screen W2 for the implementation design CAD, such as a web browser.

Suppose that the designer selects a part Pa1 displayed on the screen W1 for the circuit design tool. In this case, as illustrated in FIG. 25(2), the client 12 updates the result screen Re11 to a result screen Re2 resulting from selecting the part Pa1 on the screen W1 for the circuit design CAD tool and displays the result screen Re12.

The client 12 also receives a result screen Re22 resulting from execution, by the implementation design CAD tool, of an operation of selecting the part Pa1 from the application server 21. As illustrated in FIG. 25(3), the client 12 updates the result screen Re21 to a result screen Re22 resulting from selecting the Pa1 on the screen W2 for the implementation design CAD tool and displays the result screen Re22.

Accordingly, even when the designer uses a terminal whose performance matches the circuit design CAD tool, the link system 1 enables a link between the circuit design CAD tool running on the terminal device and the implementation design CAD tool running on the server. Furthermore, the link system 1 can link the tool running on the local terminal and the tool running on the server with each other and display them together, which allows an easy check work, by the designer, of checking the drawings between logical designing and implementation designing. Furthermore, for example, even when logical designing and implementation designing are respectively performed in different companies, the operations of the respective tools can be linked without communicating the circuit design data, which reduces the risk of information leakage.

The link system 1 according to the first embodiment further includes the portal 20 that relays communications between the client 12 and the application server 21. The portal 20 receives the terminal information on the client 12 from the client 12. According to the received terminal information, the portal 20 transmits link information relating to the implementation design CAD tool linkable with the circuit design CAD tool to the client 12. According to the transmitted link information, the portal 20 sets, as a server that communicates with the client 12, the application server 21 on which the implementation design CAD tool selected by the user who uses the client 12 runs. Accordingly, the link system 1 can construct a link environment via the portal 20.

The transmitting unit 51 of the client 12 according to the first embodiment transmits the operation information to the set application server 21 via the portal 20. The receiving unit 250 of the application server 21 receives the operation information from the client 12 via the portal 20. The transmitting unit 254 of the application server 21 transmits the result screen to the client 12 via the portal 20. Accordingly, the link system 1 can link the operation of the circuit design CAD tool and the operation of the implementation design CAD tool via the portal 20.

[b] Second Embodiment

The embodiment relating to the system disclosed herein has been described; however, the disclosed technology may be carried out in various different modes in addition to the above-described embodiment. Other embodiments covered by the invention will be described below.

Link of Operation of Implementation Design CAD Tool with Circuit Design CAD Tool For example, for the first embodiment, the case has been described where the operation result resulting from operating the implementation design CAD tool according to the operation information for operating the circuit design CAD tool is displayed; however, the disclosed system is not limited to this. For example, the link system 1 may display an operation result resulting from operating the circuit design CAD tool according to operation information for operating the implementation design CAD tool. This aspect will be described with reference to FIG. 26.

Figure 26:
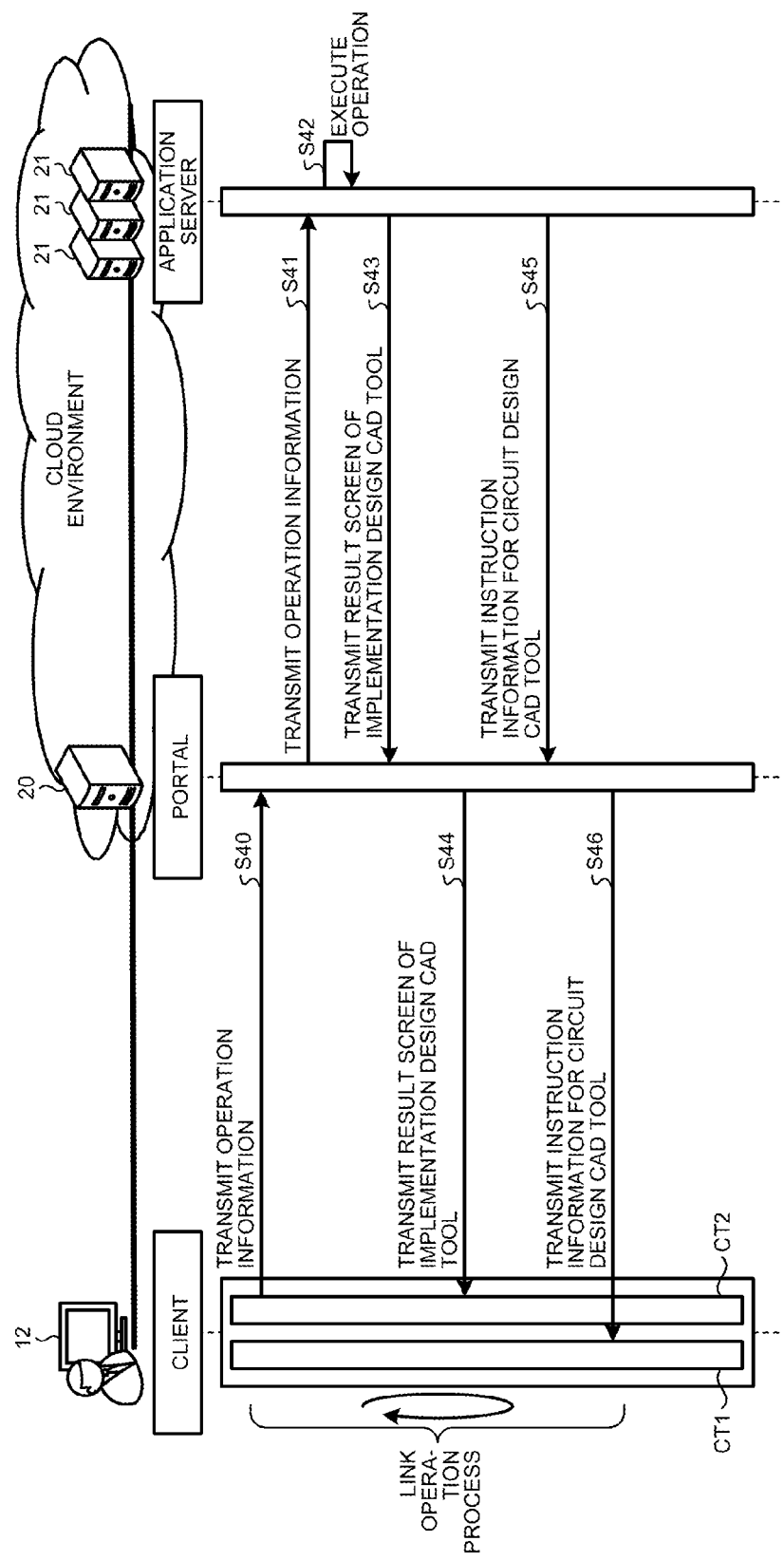
FIG. 26 is a sequence chart illustrating exemplary running of a link system according to a modification.

FIG. 26 is a sequence chart illustrating exemplary running of the link system according to a modification. As illustrated in FIG. 26, the designer operates the implementation design CAD tool CT2 via the web browser. Accordingly, the client 12 accepts operation information. The client 12 then transmits the accepted operation information to the portal 20 (S40).

The portal 20 then receives the operation information from the client 12. The portal 20 then transmits the operation information to the application server 21 in which the implementation design CAD tool CT2 is installed (S41). The application server 21 then receives the operation information from the portal 20. The application server 21 then executes the operation of the implementation design CAD tool according to the received operation information (S42).

Thereafter, the application server 21 generates a result screen of the implementation design CAD tool CT2 resulting from executing the operation of the implementation design CAD tool CT2. The application server 21 then transmits the generated result screen of the implementation design CAD tool CT2 to the portal 20 (S43). Accordingly, the portal 20 receives the result screen of the implementation design CAD tool CT2 from the application server 21. The portal 20 then transmits the received result screen of the implementation design CAD tool CT2 to the client 12 (S44). Accordingly, the client 12 receives the result screen of the implementation design CAD tool CT2 from the portal 20. The client 12 then displays the result screen of the implementation design CAD tool CT2 on the screen for the implementation design CAD tool CT2.

According to the received operation information for the implementation design CAD tool CT2, the application server 21 transmits, to the portal 20, instruction information of an instruction for the circuit design CAD tool CT1 to perform an operation corresponding to the operation information for the circuit design CAD tool CT1 (S45). Accordingly, the portal 20 receives the instruction information for the circuit design CAD tool CT1. The portal 20 then transmits the received instruction information for the circuit design CAD tool CT1 to the client 12 (S46). Accordingly, the client 12 receives the instruction information for the circuit design CAD tool CT1 from the portal 20. According to the received instruction information for the circuit design CAD tool CT1, the client 12 executes the operation of the circuit design CAD tool CT1. The client 12 then displays a result screen resulting from executing the operation of the circuit design CAD tool CT1 on the screen for the implementation design CAD tool CT2.

As described above, in the link system 1 according to the modification, the accepting unit 50 of the client 12 accepts the operation information for operating the implementation design CAD tool CT2 as the operation information. The transmitting unit 51 of the client 12 transmits the operation information to the application server 21. The receiving unit 250 of the application server 21 receives the operation information from the client 12. The generation unit 253 of the application server 21 generates, as a result screen, a result screen representing the result of operating the implementation design CAD tool CT2 according to the received operation information. The transmitting unit 254 of the application server 21 transmits, to the client 12, the generated result screen and instruction information of an instruction for the circuit design CAD tool CT1 to perform an operation corresponding to the operation information for the circuit design CAD tool CT1.

Accordingly, the link system 1 according to the modification enables a link between the tool running on the local terminal and the tool running on the server. Accordingly, for example, because the link system 1 according to the modification allows an easy work of, for example, checking drawings for checking logical designing while implementation designing, which increases working efficiency to the designer.

For the modification, the case has been described where the link system 1 performs the process (S43 and S44) of transmitting the result screen of the implementation design CAD tool CT2 to the client 12 prior to the process (S45 and S46) of transmitting the instruction information to the circuit design CAD tool CT1. The link system 1 may perform the process (S45 and S46) of transmitting the instruction information to the circuit design CAD tool CT1 prior to the process (S43 and S44) of transmitting the result screen of the implementation design CAD tool CT2 to the client 12.

Figure 27:
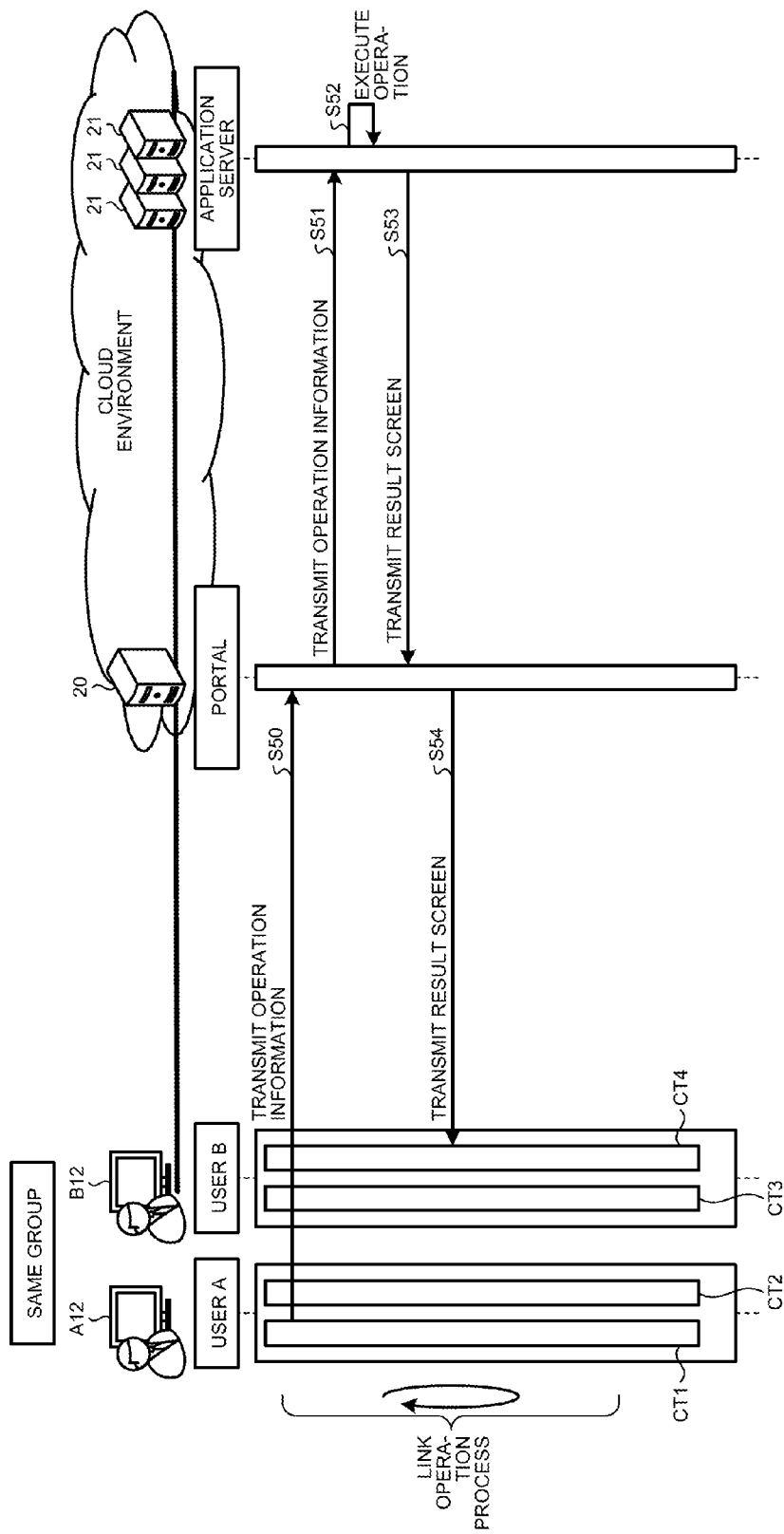
FIG. 27 is a sequence chart illustrating exemplary running of the link system according to a modification.

Transmission of Result Screen to Terminal Device of User Belonging to the Same Group The link system 1 may transmit a result screen to another device according to attribute information representing the attribute of the user who uses the client 12. This aspect will be described with reference to FIG. 27. FIG. 27 is a sequence chart illustrating an exemplary running of the link system according to the modification. According to the example illustrated in FIG. 27, the circuit design CAD tool CT1 of the client A12 used by a user A and an implementation design CAD tool CT4 of the client B12 used by a user B who belongs to the same group to which the user A belongs are linked with each other. According to the example illustrated in FIG. 27, the user A selects the implementation design CAD tool CT4 of the user B, from among linkable CAD tools of all accounts whose attribute group matches that to which the user A belongs, as the CAD tool to be linked.

As illustrated in FIG. 27, the user A operates the circuit design CAD tool CT1 of the client A12. Accordingly, the client A12 accepts operation information for the circuit design CAD tool CT1. The client A12 then transmits the accepted operation information to the portal 20 (S50).

The portal 20 then receives the operation information from the client 12. The portal 20 then transmits the operation information to the application server 21 in which the implementation design CAD tool CT4 is installed (S51). The application server 21 then receives the operation information from the portal 20. The application server 21 then executes the operation of the implementation design CAD tool CT4 according to the received operation information (S52).

The application server 21 then generates the result screen of the implementation design CAD tool CT4 resulting from execution of the operation of the implementation design CAD tool CT4. The application server 21 then transmits the generated result screen of the implementation design CAD tool CT4 to the portal 20 (S53). Accordingly, the portal 20 receives the result screen of the implementation design CAD tool CT4 from the application server 21.

The portal 20 transmits the received result screen of the implementation design CAD tool CT4 (S54). The portal 20 transmits the result screen to another client according to the attribute information representing the attribute of the user who uses the client A12. This aspect will be described in detail with reference to FIG. 28.

Figure 28:
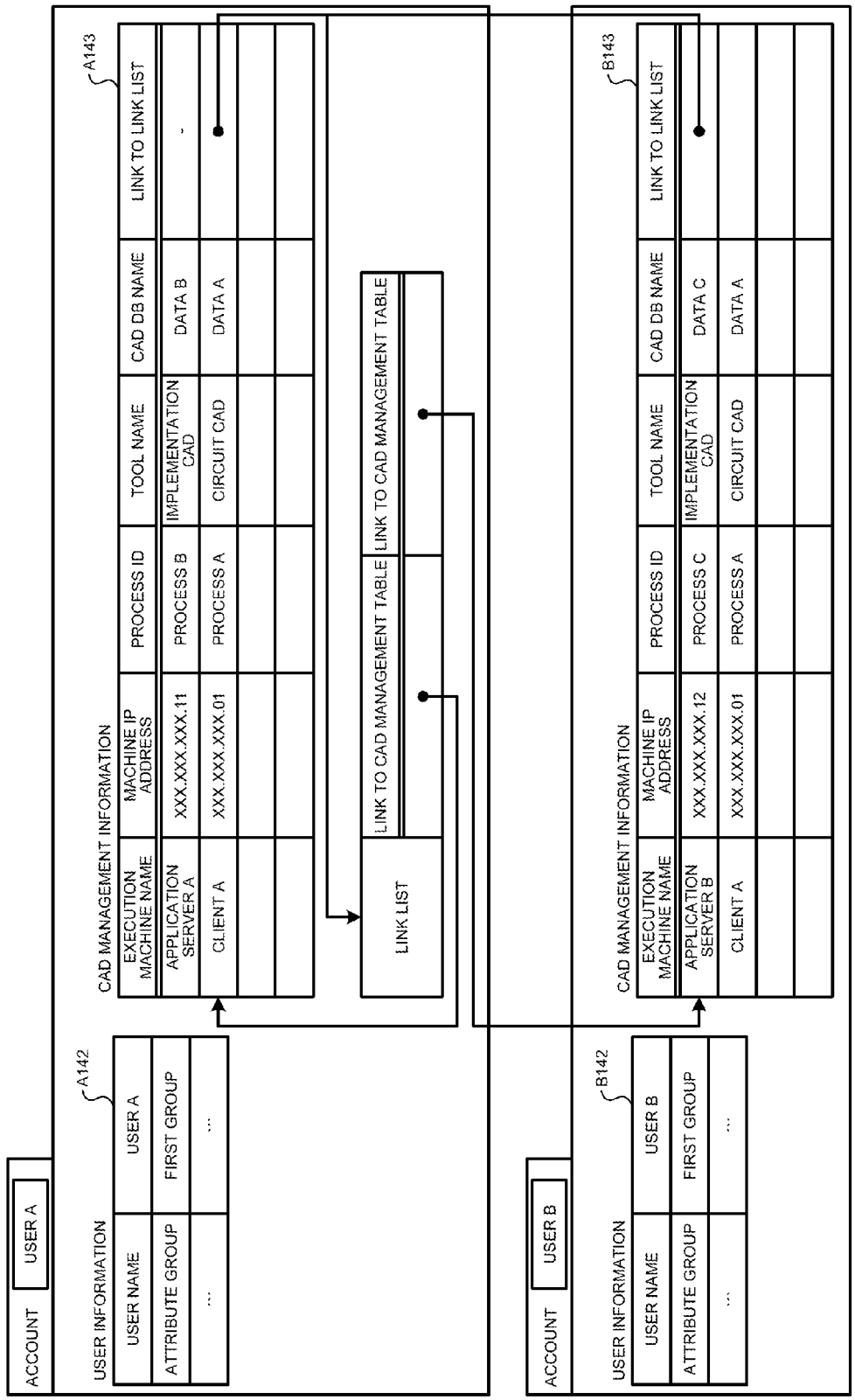
FIG. 28 is an explanatory view for explaining a link list according to the modification.

FIG. 28 is an explanatory view for explaining a link list according to the modification. According to the example illustrated in FIG. 28, user information A142 represents that the group to which the user A belongs is a first group. User information B142 represents that the group to which the user B belongs is a first group. In other words, according to the example illustrated in FIG. 28, the user B belongs to the same group as that to which the user A belongs. Furthermore, CAD management information A143 and CAD management information B143 represent that the client A12 used by the user A and having the execution machine name of "CLIENT A" is linked with "APPLICATION SERVER B" of the implementation design CAD tool CT4 used by the user B via the web browser. In this case, the portal 20 transmits the result screen to the client B12 used by the user B who belongs to the same group to which the user A belongs.

Accordingly, the client B12 receives the result screen of the implementation design CAD tool CT4 from the portal 20. The client B12 then displays the result screen of the implementation design CAD tool CT4 on a screen for the implementation design CAD tool CT4.

As descried above, according to the link system 1 according to the modification, the transmitting unit 254 of the application server 21 transmits the result screen to the client B12 according to the attribute information representing the attribute of the user who uses the client A12. Accordingly, the link system 1 according to the modification can link the circuit design CAD tool and the implementation design CAD tool, of terminal devices used by users belonging to the same group, with each other. For this reason, according to the link system 1 according to the modification, for example, because the designer of implementation designing can perform implementation designing while checking the operation by the designer of logical designing, the work efficiency to the designers can be increased.

Virtual Machine

For the embodiments, the case has been described where the implementation design CAD tool is installed in the application server 21; however, the disclosed system is not limited to this. For example, for example, in the link system 1, the implementation design CAD tool may be installed in multiple VM servers that are virtual machines constructed on the cloud. In this case, the designer operates the implementation design CAD tool of the VM servers and checks the operation results via the web browser. Accordingly, the machine used by the designer can perform implementation designing even when the performance of the machine used by the designer does not enable running the implementation CAD tool, which reduces the costs. Furthermore, in the link system 1, the circuit design CAD tool may be installed in a VM server. In this case, the designer operates the circuit design CAD tool via the web browser. Accordingly, circuit designing can be performed as long as the performance of the machine used by the designer enables operations and inputs, which reduces the costs.

Multiple CAD Tools

For the embodiments, the case has been describe where the circuit design CAD tool and the implementation design CAD tool are linked; however, the disclosed system is not limited to this. For example, the link system 1 may link three or more tools. Furthermore, the link system 1 may link the circuit design CAD tool and the implementation design CAD tool, installed in the application servers 21, on the cloud.

Transmitting and Receiving Data

For the embodiments, the case has been described where the client 12 and the application server 21 transmit and receive data via the portal 20; however, the disclosed system is not limited to this. For example, in the link system 1, the client 12 and the application server 21 may transmit and receive data not via the portal 20. For example, the client 12 may directly transmit operation information to the application server 21. The application server 21 may directly receive the operation information from the client 12. The application server 21 may directly transmit a result screen to the client 12.

Various components of various devices in the drawings are of a functional idea and are not necessarily configured physically as illustrated in the drawings. In other words, a specific mode of dispersion and integration of each device is not limited to that illustrated in the drawings. All or part of the components may be configured by dispersing or integrating them functionally or physically in accordance with various loads or the usage in an arbitrary unit. For example, various processing units of the accepting unit 50, the transmitting unit 51, the receiving unit 52, and the display control unit 53 may be integrated as appropriate. The process performed by each processing unit may be separated into processes performed by multiple processing units. Furthermore, all or part of various processing functions implemented by various processing units may be implemented by a CPU and a program that is analyzed and executed by the CPU, or may be implemented by the hard-wired logic.

Link Program

Figure 29:
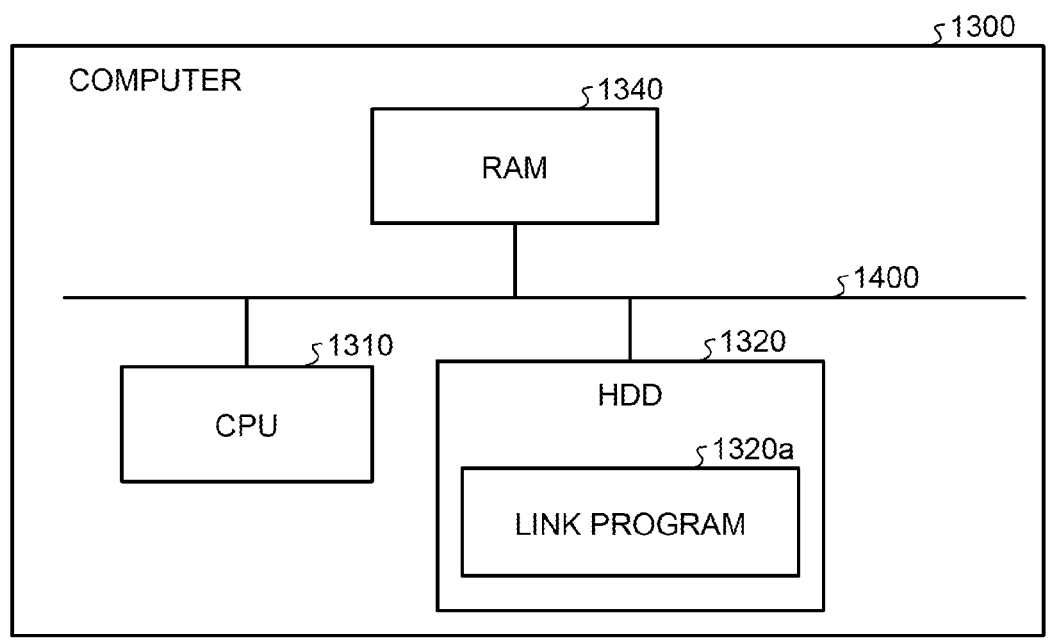
FIG. 29 is a diagram illustrating a computer that executes a link program.

The various processes described above may be implemented by executing a program prepared in advance by using a computer system, such as a personal computer or a work station. An exemplary computer system that executes a program having the same functions as those of the embodiments will be described below. FIG. 29 is a diagram illustrating a computer that executes a link program.

As illustrated in FIG. 29, a computer 1300 includes a central processing unit (CPU) 1310, a hard disk drive (HDD) 1320, and a random access memory (RAM) 1340. The units 1310 to 1340 are connected via a bus 1400.

A link program 1320a that implements the same functions as those of the accepting unit 50, the transmitting unit 51, the receiving unit 52, and the display control unit 53 of the client 12 and the receiving unit 250, the read unit 251, the execution unit 252, the generation unit 253, and the transmitting unit 254 of the application server 21 is stored in advance in the HDD 1320. In other words, the link program 1320a includes a program that implements the same functions as those of the client 12 and a program that implements the same functions as those of the application server 21. The link program 1320a may be divided as appropriate. The link program 1320a may further include a program that implements the same functions as those of the receiving unit 150, the storing unit 151, the allocation unit 152, the transmitting unit 153, and the setting unit 154 of the portal 20.

The HDD 1320 stores various types of information. For example, the HDD 1320 stores OS and various types of data used for dispersing requests for selecting range.

The CPU 1310 reads the link program 1320a from the HDD 1320 and executes the link program 1320a to implement the same operations as those of the processing units according to the embodiments. In other words, the link program 1320a implements the same operations as those of the accepting unit 50, the transmitting unit 51, the receiving unit 52, and the display control unit 53, of the client 12.

The link program 1320a does not necessarily have to be stored in the HDD 1320 from the beginning.

For example, the program may be stored in a "portable physical medium", such as a flexible disk (FD), a CD-ROM, a DVD disk, a magneto-optical disk, or an IC card. The computer 1300 may read the program from the medium and execute the program.

Alternatively, the program may be stored in "another computer (or server)" connected to the computer 1300 via, for example, a public line, the Internet, a LAN, or a WAN. The computer 1300 may read the program from the computer (or server) and execute the program.

According to one aspect of the embodiments, the tool running on the local terminal and the tool running on the server can be linked with each other.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A link system comprising a terminal device on which a first application runs and a server on which a second application linkable with the first application runs, wherein
the terminal device includes a memory and a processor coupled to the memory, the processor executing a process including:
accepting operation information for operating the first application; and
transmitting the accepted operation information to the server, and
the server includes a memory and a processor coupled to the memory, the processor executing a process including:
receiving the operation information transmitted by the terminal device;
generating a result screen representing a result of operating the second application according to the received operation information; and
transmitting the generated result screen to the terminal device,
in the terminal device, an operation of an implementation design CAD tool is performed when an operation of a circuit design CAD tool is executed, so that a load of operation performed by each of the design CAD tools is reduced,
the accepting, at the terminal device, includes accepting operation information for operating the second application as an operation information;
the transmitting, at the terminal device, includes transmitting the accepted operation information to the server,
the receiving, at the server, includes receiving the operation information from the terminal device,
the generating, at the server, includes generating, as the result screen, a result screen representing a result of operating the second application according to the received operation information, and
the transmitting, at the server, includes transmitting, to the terminal device, the generated result screen and instruction information of an instruction for the first application to perform an operation corresponding to the received operation information,
the transmitting the instruction information to the first application is performed prior to the transmitting the result screen of the second application to the terminal device.

2. The link system according to claim 1, wherein the process at the terminal device further includes displaying the result screen transmitted by the server on a screen for the second application.

3. The link system according to claim 1, further comprising a relay device that relays communications between the terminal device and the server, wherein
the relay device includes a memory and a processor coupled to the memory, the processor executing a process including:
receiving terminal information relating to the terminal device from the terminal device;
transmitting, to the terminal device, link information relating to the second application linkable with the first application, according to the received terminal information; and
setting, as a server that communicates with the terminal device, the server on which the second application runs, which is the server selected by a user who uses the terminal device, according to the transmitted link information.

4. The link system according to claim 3, wherein
the transmitting, at the terminal device, includes transmitting the operation information to the server, which is set at the setting, via the relay device,
the receiving, at the server, includes receiving the operation information from the terminal device via the relay device; and
the transmitting, at the server, includes transmitting the result screen to the terminal device via the relay device.

5. The link system according to claim 1, wherein the transmitting, at the server, includes transmitting the result screen to another terminal device according to attribute information representing an attribute of a user who uses the terminal device.

6. A non-transitory computer-readable recording medium having stored therein a program that causes a computer to execute a process comprising:
  causing a terminal device on which a first application runs to
    accept operation information for operating the first application, and
    transmit the accepted operation information to the server; and
  causing the server on which a second application linkable with the first application runs to
    receive the transmitted operation information,
    generate a result screen representing a result of operating the second application according to the received operation information, and
    transmit the generated result screen to the terminal device,
  in the terminal device, an operation of an implementation design CAD tool is performed when an operation of a circuit design CAD tool is executed, so that a load of operation performed by each of the design CAD tools is reduced,
  the accepting, at the terminal device, includes accepting operation information for operating the second application as an operation information;
  the transmitting, at the terminal device, includes transmitting the accepted operation information to the server,
  the receiving, at the server, includes receiving the operation information from the terminal device,
  the generating, at the server, includes generating, as the result screen, a result screen representing a result of operating the second application according to the received operation information, and
  the transmitting, at the server, includes transmitting, to the terminal device, the generated result screen and instruction information of an instruction for the first application to perform an operation corresponding to the received operation information, wherein
  the transmitting the instruction information to the first application is performed prior to the transmitting the result screen of the second application to the terminal device.

7. The non-transitory computer-readable recording medium according to claim 6, wherein the process comprises causing a relay device that relays communications between the terminal device and the server to
  receive terminal information relating to the terminal device from the terminal device,
  transmit link information relating to the second application linkable with the first application, according to the received terminal information, and
  set, as a server that communicates with the terminal device, the server on which the second application runs, which is the server selected by a user who uses the terminal device, according to the transmitted link information.

8. A link method comprising:
  by a terminal device on which a first application runs,
    accepting operation information for operating the first application; and
    transmitting the accepted operation information to the server; and
  by a server on which a second application linkable with the first application runs,
    receiving the transmitted operation information;
    generating a result screen representing a result of operating the second application according to the received operation information; and
    transmitting the generated result screen to the terminal device,
  in the terminal device, an operation of an implementation design CAD tool is performed when an operation of a circuit design CAD tool is executed, so that a load of operation performed by each of the design CAD tools is reduced,
  the accepting, at the terminal device, includes accepting operation information for operating the second application as an operation information;
  the transmitting, at the terminal device, includes transmitting the accepted operation information to the server,
  the receiving, at the server, includes receiving the operation information from the terminal device,
  the generating, at the server, includes generating, as the result screen, a result screen representing a result of operating the second application according to the received operation information, and
  the transmitting, at the server, includes transmitting, to the terminal device, the generated result screen and instruction information of an instruction for the first application to perform an operation corresponding to the received operation information, wherein
  the transmitting the instruction information to the first application is performed prior to the transmitting the result screen of the second application to the terminal device.

9. The link method according to claim 8 further comprising:
  by a relay device that relays communications between the terminal device and the server,
    receiving terminal information relating to the terminal device from the terminal device;
    transmitting link information relating to the second application linkable with the first application, according to the received terminal information; and
  setting, as a server that communicates with the terminal device, the server on which the second application runs, which is the server selected by a user who uses the terminal device, according to the transmitted link information.

* * * * *